(12) United States Patent
Hussell et al.

(10) Patent No.: US 9,859,471 B2
(45) Date of Patent: Jan. 2, 2018

(54) HIGH BRIGHTNESS LIGHT EMITTING DIODE (LED) PACKAGES, SYSTEMS AND METHODS WITH IMPROVED RESIN FILLING AND HIGH ADHESION

(75) Inventors: Christopher P. Hussell, Cary, NC (US); Sung Chul Joo, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/362,683

(22) Filed: Jan. 31, 2012

(65) Prior Publication Data
US 2012/0300491 A1 Nov. 29, 2012

Related U.S. Application Data

(60) Provisional application No. 61/462,248, filed on Jan. 31, 2011.

(51) Int. Cl.
*H01L 21/28* (2006.01)
*H01L 33/48* (2010.01)
(Continued)

(52) U.S. Cl.
CPC ............ *H01L 33/486* (2013.01); *H01L 24/49* (2013.01); *H01L 33/62* (2013.01);
(Continued)

(58) Field of Classification Search
CPC ....... H01L 33/62; H01L 33/20; H01L 33/382; H01L 33/385; H01L 33/48
(Continued)

(56) References Cited

U.S. PATENT DOCUMENTS

| 4,679,118 A | 7/1987 | Johnson et al. |
| 4,946,547 A | 8/1990 | Palmour |

(Continued)

FOREIGN PATENT DOCUMENTS

| CN | 1194461 | 9/1998 |
| CN | 1925182 | 3/2007 |

(Continued)

OTHER PUBLICATIONS

Taiwanese Notice of Allowance for Application No. 100305347 dated Mar. 23, 2012.
(Continued)

*Primary Examiner* — Sean Gramling
*Assistant Examiner* — Gerald J Sufleta, II
(74) *Attorney, Agent, or Firm* — Jenkins, Wilson, Taylor & Hunt, P.A.

(57) ABSTRACT

High-brightness light emitting diode (LED) packages, systems and methods with improved resin filling and high adhesion are provided. In one aspect, a high brightness package for a light emitter (e.g., a LED or LED chip) can include a body and a cavity disposed in the body. The cavity can include at least one cavity wall extending toward an intersection area of the body where the cavity wall intersects a cavity floor. The package can further include at least one electrical element having first and second surfaces, each of the first and second surfaces proximate the intersection area. The first surface can be disposed on a first plane and the second surface can be at least partially disposed on a second plane that is different than the first plane. The body can at least substantially cover the second surface.

36 Claims, 15 Drawing Sheets

(51) Int. Cl.
   *H01L 33/62* (2010.01)
   *H01L 23/00* (2006.01)
   *H01L 25/075* (2006.01)
   *H01L 25/16* (2006.01)
   *H01L 33/64* (2010.01)

(52) U.S. Cl.
   CPC ........ *H01L 25/0753* (2013.01); *H01L 25/167* (2013.01); *H01L 33/64* (2013.01); *H01L 2224/48091* (2013.01); *H01L 2224/48137* (2013.01); *H01L 2224/48247* (2013.01); *H01L 2224/48465* (2013.01); *H01L 2224/48471* (2013.01); *H01L 2224/4945* (2013.01); *H01L 2924/00014* (2013.01); *H01L 2924/01322* (2013.01); *H01L 2924/12032* (2013.01); *H01L 2924/12035* (2013.01); *H01L 2924/12041* (2013.01); *H01L 2924/181* (2013.01); *H01L 2924/19107* (2013.01); *H01L 2933/0033* (2013.01)

(58) Field of Classification Search
   USPC ........ 362/631, 630, 310, 311.02; 257/99, 98
   See application file for complete search history.

(56) References Cited

U.S. PATENT DOCUMENTS

| | | | |
|---|---|---|---|
| 5,200,022 A | 4/1993 | Kong | |
| 5,210,051 A | 5/1993 | Carter, Jr. | |
| RE34,861 E | 2/1995 | Davis et al. | |
| 5,393,993 A | 2/1995 | Edmond | |
| 5,506,446 A | 4/1996 | Hoffman et al. | |
| 5,523,589 A | 6/1996 | Edmond | |
| 6,020,632 A | 2/2000 | Barone et al. | |
| 6,274,924 B1 | 8/2001 | Carey et al. | |
| 6,335,548 B1 | 1/2002 | Roberts et al. | |
| 6,498,355 B1 | 12/2002 | Harrah | |
| 6,610,563 B1 | 8/2003 | Waitl | |
| 6,674,159 B1 | 1/2004 | Peterson et al. | |
| 6,806,583 B2 | 10/2004 | Koay et al. | |
| 6,828,170 B2 | 12/2004 | Roberts et al. | |
| 6,921,927 B2 | 7/2005 | Ng et al. | |
| 6,936,855 B1 | 8/2005 | Harrah | |
| 6,943,433 B2 | 9/2005 | Kamada | |
| 6,949,771 B2 | 9/2005 | Yoganandan et al. | |
| D514,073 S | 1/2006 | Suenaga | |
| 7,081,661 B2 | 7/2006 | Takehara et al. | |
| 7,098,483 B2 | 8/2006 | Mazzochette et al. | |
| 7,224,047 B2 | 5/2007 | Carberry et al. | |
| 7,244,965 B2 | 7/2007 | Andrews et al. | |
| 7,249,790 B2 | 7/2007 | Potts et al. | |
| 7,253,448 B2 | 8/2007 | Roberts et al. | |
| D566,055 S | 4/2008 | Kim | |
| 7,361,940 B2 | 4/2008 | Kim et al. | |
| D573,113 S | 7/2008 | Bando | |
| D573,114 S | 7/2008 | Min et al. | |
| 7,400,049 B2 | 7/2008 | Shim | |
| 7,432,589 B2 | 10/2008 | Yamamoto et al. | |
| D580,375 S | 11/2008 | Yen | |
| D580,381 S | 11/2008 | Bando | |
| D580,891 S | 11/2008 | Sung et al. | |
| 7,456,499 B2 | 11/2008 | Loh | |
| 7,462,870 B2 | 12/2008 | Nakashima | |
| D584,699 S | 1/2009 | Bando | |
| D594,827 S | 6/2009 | Loh et al. | |
| 7,564,180 B2 | 6/2009 | Brandes | |
| D595,675 S | 7/2009 | Wang et al. | |
| 7,566,159 B2 | 7/2009 | Oon et al. | |
| D597,968 S | 8/2009 | Kobayakawa et al. | |
| D597,971 S | 8/2009 | Kobayakawa et al. | |
| D598,400 S | 8/2009 | Bando | |
| 7,592,638 B2 | 9/2009 | Kim | |
| 7,659,551 B2 | 2/2010 | Loh | |
| D614,592 S | 4/2010 | Hussell et al. | |
| 7,692,206 B2 | 4/2010 | Loh | |
| D615,504 S | 5/2010 | Keller et al. | |
| 7,719,024 B2 | 5/2010 | Bando | |
| D621,798 S | 8/2010 | Lu et al. | |
| D621,799 S | 8/2010 | Hussell et al. | |
| D622,680 S | 8/2010 | Lin et al. | |
| 7,791,061 B2 | 9/2010 | Edmond et al. | |
| D626,095 S | 10/2010 | Hsieh | |
| D627,310 S | 11/2010 | Lin et al. | |
| D628,541 S | 12/2010 | Lin | |
| 7,852,015 B2 | 12/2010 | Yen et al. | |
| 7,858,993 B2 | 12/2010 | Kong et al. | |
| D632,267 S | 2/2011 | Chen et al. | |
| D632,659 S | 2/2011 | Hsieh | |
| D634,284 S | 3/2011 | Ko et al. | |
| D634,285 S | 3/2011 | Ko et al. | |
| D634,286 S | 3/2011 | Ko et al. | |
| D634,716 S | 3/2011 | Suzuki | |
| D635,527 S | 4/2011 | Hussell et al. | |
| 7,923,739 B2 | 4/2011 | Hussell | |
| 7,960,819 B2 | 6/2011 | Loh et al. | |
| D641,719 S | 7/2011 | Hussell et al. | |
| D643,819 S | 8/2011 | Joo | |
| D648,686 S | 11/2011 | Hussell et al. | |
| D648,687 S | 11/2011 | Joo et al. | |
| D658,599 S | 5/2012 | Takahashi et al. | |
| D659,657 S | 5/2012 | Hussell et al. | |
| D661,264 S | 6/2012 | Joo et al. | |
| D667,801 S | 9/2012 | Joo et al. | |
| 8,269,244 B2 | 9/2012 | Hussell | |
| 8,278,680 B2 | 10/2012 | Lan et al. | |
| 8,337,029 B2 | 12/2012 | Li | |
| 8,354,992 B2 | 1/2013 | Rumreich et al. | |
| D679,842 S | 4/2013 | Joo et al. | |
| 8,497,522 B2 | 7/2013 | Hussell | |
| 8,598,602 B2 | 12/2013 | Hussell | |
| 8,610,140 B2 | 12/2013 | Joo | |
| 8,648,359 B2 | 2/2014 | Hussell | |
| 8,686,445 B1 | 4/2014 | Hussell et al. | |
| D704,358 S | 5/2014 | Joo et al. | |
| D708,156 S | 7/2014 | Joo et al. | |
| 8,860,043 B2 | 10/2014 | Emerson et al. | |
| 8,866,166 B2 | 10/2014 | Hussell | |
| 8,878,217 B2 | 11/2014 | Hussell | |
| 9,111,778 B2 | 8/2015 | Emerson et al. | |
| 9,123,874 B2 | 9/2015 | Hussell et al. | |
| 2001/0045640 A1 | 11/2001 | Oida et al. | |
| 2002/0004251 A1 | 1/2002 | Roberts et al. | |
| 2003/0168720 A1* | 9/2003 | Kamada | B29C 45/14655 257/666 |
| 2004/0075100 A1 | 4/2004 | Bogner et al. | |
| 2004/0079957 A1 | 4/2004 | Andrews et al. | |
| 2004/0087057 A1 | 5/2004 | Wang et al. | |
| 2004/0126913 A1* | 7/2004 | Loh | 438/26 |
| 2005/0224830 A1 | 10/2005 | Blonder et al. | |
| 2005/0269587 A1 | 12/2005 | Loh et al. | |
| 2006/0006405 A1 | 1/2006 | Mazzochette | |
| 2006/0043401 A1 | 3/2006 | Lee et al. | |
| 2006/0118808 A1 | 6/2006 | Sadamu et al. | |
| 2006/0157726 A1 | 7/2006 | Loh et al. | |
| 2006/0175716 A1 | 8/2006 | Nakashima | |
| 2006/0186418 A1 | 8/2006 | Edmond et al. | |
| 2006/0220050 A1 | 10/2006 | Higaki et al. | |
| 2007/0029664 A1 | 2/2007 | Mohammed et al. | |
| 2007/0052074 A1 | 3/2007 | Hasegawa | |
| 2007/0057364 A1 | 3/2007 | Wang et al. | |
| 2007/0075325 A1 | 4/2007 | Baek et al. | |
| 2007/0114514 A1 | 5/2007 | Shin | |
| 2007/0138497 A1 | 6/2007 | Loh | |
| 2007/0241362 A1 | 10/2007 | Han et al. | |
| 2007/0252523 A1 | 11/2007 | Maeda et al. | |
| 2007/0262328 A1 | 11/2007 | Bando | |
| 2008/0006837 A1 | 1/2008 | Park et al. | |
| 2008/0019133 A1 | 1/2008 | Kim et al. | |
| 2008/0023722 A1 | 1/2008 | Lee et al. | |
| 2008/0048201 A1 | 2/2008 | Kim et al. | |
| 2008/0185605 A1 | 8/2008 | Wada et al. | |
| 2008/0258130 A1 | 10/2008 | Bergmann et al. | |
| 2008/0258162 A1 | 10/2008 | Koung et al. | |

(56) References Cited

U.S. PATENT DOCUMENTS

| | | |
|---|---|---|
| 2008/0278941 A1 | 11/2008 | Logan et al. |
| 2008/0283849 A1 | 11/2008 | Imai |
| 2008/0290353 A1 | 11/2008 | Medendorp |
| 2009/0008662 A1 | 1/2009 | Ashdown et al. |
| 2009/0086487 A1 | 4/2009 | Ruud |
| 2009/0101921 A1 | 4/2009 | Lai |
| 2009/0121249 A1* | 5/2009 | Tseng et al. .................. 257/98 |
| 2009/0122533 A1 | 5/2009 | Brukilacchio |
| 2009/0159905 A1 | 6/2009 | Chen |
| 2009/0189178 A1 | 7/2009 | Kim et al. |
| 2009/0267085 A1 | 10/2009 | Lee et al. |
| 2009/0321779 A1 | 12/2009 | Chang et al. |
| 2010/0059783 A1 | 3/2010 | Chandra |
| 2010/0102345 A1 | 4/2010 | Sung et al. |
| 2010/0133554 A1 | 6/2010 | Hussell |
| 2010/0133578 A1 | 6/2010 | Pickard et al. |
| 2010/0155748 A1 | 6/2010 | Chan et al. |
| 2010/0163887 A1 | 7/2010 | Kim et al. |
| 2010/0181582 A1 | 7/2010 | Li et al. |
| 2010/0210048 A1 | 8/2010 | Urano |
| 2010/0237360 A1* | 9/2010 | Kao et al. ..................... 257/88 |
| 2010/0270577 A1 | 10/2010 | Rulkens et al. |
| 2011/0001162 A1 | 1/2011 | Nakayama et al. |
| 2011/0006658 A1 | 1/2011 | Chan |
| 2011/0031865 A1 | 2/2011 | Hussell et al. |
| 2011/0090711 A1* | 4/2011 | Kim ............................ 362/611 |
| 2011/0180827 A1 | 7/2011 | Hussell |
| 2011/0186873 A1 | 8/2011 | Emerson |
| 2011/0186898 A1* | 8/2011 | Lan ........................ H01L 23/48 257/99 |
| 2011/0242450 A1* | 10/2011 | Kashimura et al. ............ 349/61 |
| 2011/0316022 A1 | 12/2011 | Hussell |
| 2012/0069560 A1 | 3/2012 | Miskin et al. |
| 2012/0127720 A1 | 5/2012 | Hussell et al. |
| 2012/0153317 A1 | 6/2012 | Emerson et al. |
| 2012/0307481 A1 | 12/2012 | Joo et al. |
| 2013/0003375 A1 | 1/2013 | Hussell |
| 2013/0011946 A1 | 1/2013 | Hussell |
| 2014/0027801 A1 | 1/2014 | Hussell |

FOREIGN PATENT DOCUMENTS

| | | |
|---|---|---|
| CN | 101060157 | 10/2007 |
| CN | 101142692 A | 3/2008 |
| CN | 201054361 | 4/2008 |
| CN | 101432896 | 5/2009 |
| CN | 101639181 | 2/2010 |
| CN | 101765627 A | 6/2010 |
| CN | ZL 2011-30010728 | 1/2012 |
| CN | ZL201130171313.0 | 4/2012 |
| CN | 103080646 B | 12/2016 |
| CN | 103534821 B | 3/2017 |
| EP | 1 756 879 | 1/2009 |
| EP | 2 438 631 | 4/2012 |
| EP | 2 603 930 | 6/2013 |
| EP | 2 628 196 | 7/2013 |
| JP | D1102760 | 3/2001 |
| JP | 2002-280616 | 9/2002 |
| JP | 2005-179147 | 7/2005 |
| JP | 2005-209763 | 8/2005 |
| JP | 2006-093738 | 4/2006 |
| JP | 2006-173561 | 6/2006 |
| JP | 2007-108547 | 4/2007 |
| JP | 2007-335762 | 12/2007 |
| JP | 2007-335765 | 12/2007 |
| JP | 2008-071954 | 3/2008 |
| JP | 2008-072092 | 3/2008 |
| JP | 2008-091792 | 4/2008 |
| JP | 2008-098218 | 4/2008 |
| JP | 2008-103480 | 5/2008 |
| JP | 2008-147611 | 6/2008 |
| JP | 2008-533716 | 8/2008 |
| JP | 2008-545269 | 12/2008 |
| JP | D1346959 | 12/2008 |
| JP | 2009-016636 | 1/2009 |
| JP | 3154368 | 9/2009 |
| JP | 2010-034262 | 2/2010 |
| JP | 2010-205776 | 9/2010 |
| JP | 1416396 | 5/2011 |
| JP | 1431637 | 12/2011 |
| JP | 1433335 | 1/2012 |
| JP | D1433030 | 1/2012 |
| JP | 1441805 | 4/2012 |
| KR | 10-0591687 | 6/2006 |
| KR | 10-20070000130 | 1/2007 |
| KR | 10-2007-0055361 | 5/2007 |
| KR | 10-0845856 | 7/2008 |
| KR | 1020090003378 | 1/2009 |
| KR | 10-0967451 | 7/2010 |
| KR | 30-0681227 | 2/2013 |
| KR | 30-0697636 | 6/2013 |
| KR | 10-1578090 | 12/2015 |
| TW | 200711166 | 3/2007 |
| TW | 200928203 | 7/2009 |
| TW | M376119 U1 | 3/2010 |
| TW | M376909 | 3/2010 |
| TW | 201013969 | 4/2010 |
| TW | M383822 | 7/2010 |
| TW | 100305347 | 3/2012 |
| TW | D146222 | 4/2012 |
| TW | D148144 | 7/2012 |
| TW | I515932 | 1/2016 |
| TW | I560915 | 12/2016 |
| TW | I591866 | 7/2017 |
| WO | WO 2006/059828 | 6/2006 |
| WO | WO 2006/095949 | 9/2006 |
| WO | WO 2007/126720 | 11/2007 |
| WO | WO 2008/021268 | 2/2008 |
| WO | WO 2008/069204 | 6/2008 |
| WO | WO 2009/063255 | 5/2009 |
| WO | WO-2010/020105 | 2/2010 |
| WO | WO-2010/141215 | 3/2011 |
| WO | WO 2012/005984 | 1/2012 |
| WO | WO 2012/021238 | 2/2012 |
| WO | WO 2012/050994 | 4/2012 |
| WO | WO 2012/100060 | 7/2012 |
| WO | WO 2012/106312 | 8/2012 |
| WO | WO 2012/109225 | 8/2012 |
| WO | WO 2012/151270 | 11/2012 |

OTHER PUBLICATIONS

Notice of Allowance for U.S. Appl. No. 13/082,699 dated Oct. 23, 2012.
Korean Decision to Grant for Application No. KR 30-2011-0027245 dated Nov. 19, 2012.
Korean Decision to Grant for Application No. KR 30-2011-0027244 dated Nov. 19, 2012.
Korean Decision to Grant for Application No. KR 30-2011-0027243 dated Nov. 26, 2012.
Korean Decision to Grant for Application No. KR 30-2010-0047048 dated Nov. 26, 2012.
Notice of Allowance for U.S. Appl. No. 29/382,394 dated Nov. 27, 2012.
Supplemental Notice of Allowance for U.S. Appl. No. 29/382,394 dated Jan. 14, 2013.
Non-Final Office Action for U.S. Appl. No. 13/462,450 dated Jan. 15, 2013.
DE 10 2005 002 297.9, Aug. 4, 2005, Hamberger Industriewerke Gmbh.
CN 200930286397.5, Oct. 6, 2010, CREE, INC.
EP Community Design No. 001242234, Jan. 5, 2011, CREE, INC.
Description Model No. NS6x083x issued by Nichia Corporation—at least as early as Feb. 17, 2007.
Description Model No. NS6G083 issued by Nichia Corporation—at least as early as Aug. 31, 2007.
Design U.S. Appl. No. 29/330,657, filed Jan. 12, 2009.
Design U.S. Appl. No. 12/479,318, filed Jun. 5, 2009.
Design U.S. Appl. No. 29/338,186, filed Jun. 5, 2009.
U.S. Appl. No. 12/498,856, filed Jul. 7, 2009.

(56) References Cited

OTHER PUBLICATIONS

Notice of Allowance from U.S. Appl. No. 29/330,657 dated Sep. 25, 2009.
Design U.S. Appl. No. 29/353,652, filed Jan. 12, 2010.
Notice of Allowance dated Apr. 16, 2010 from U.S. Appl. No. 29/338,186.
Design U.S. Appl. No. 29/360,791, filed Apr. 30, 2010.
U.S. Appl. No. 12/535,353.
Chinese Notice of Patent Grant for CN 200930286397.5 dated May 19, 2010.
Non-Final Office Action for U.S. Appl. No. 12/479,318 dated Jun. 2, 2010.
U.S. Appl. No. 12/825,075, filed Jun. 28, 2010 (now U.S. Publ. No. 2011/0031865).
Related Design U.S. Appl. No. 29/365,939, filed Jul. 16, 2010.
U.S. Appl. No. 12/853,812, filed Aug. 10, 2010.
Notice of Allowance for U.S. Appl. No. 29/353,652 dated Aug. 24, 2010.
U.S. Appl. No. 61/404,985, filed Oct. 13, 2010.
Non-final Office Action for U.S. Appl. No. 12/479,318 dated Nov. 10, 2010.
Notice of Allowance for U.S. Appl. No. 29/353,652 dated Nov. 26, 2010.
Supplemental Notice of Allowance for U.S. Appl. No. 29/353,652 dated Dec. 8, 2010.
U.S. Appl. No. 12/969,267, filed Dec. 15, 2010.
Notice of Allowance for U.S. Appl. No. 29/360,791 dated Dec. 22, 2010.
Notice of Allowance for U.S. Appl. No. 29/365,939 dated Dec. 27, 2010.
Related Design U.S. Appl. No. 29/382,394, filed Jan. 3, 2011.
International Search Report/Written Opinion dated Jan. 5, 2011 for PCT/US2010/035379.
Certificate of Registration for Community Design Application Serial No. 001283600-0001-0003 dated Jan. 7, 2011.
U.S. Appl. No. 13/011,609, filed Jan. 21, 2011.
Supplemental Notice of Allowance for U.S. Appl. No. 29/360,791 dated Jan. 24, 2011.
Notice of Allowance for U.S. Appl. No. 12/479,318 dated Feb. 17, 2011.
Notice of Allowance for U.S. Appl. No. 29/338,186 dated Mar. 10, 2011.
Notice of Allowance for Japanese Design Appl. No. 2010-026186 dated Mar. 29, 2011.
Supplemental Notice of Allowability for U.S. Appl. No. 12/479,318 dated Apr. 5, 2011.
Japanese Office Action for JP2010-026185 dated Apr. 5, 2011.
Notice of Allowance for Design U.S. Appl. No. 29/360,791 dated Apr. 12, 2011.
Notice of Allowance for Design U.S. Appl. No. 29/365,939 dated Apr. 12, 2011.
Supplemental Notice of Allowance for Design U.S. Appl. No. 29/338,186 dated May 20, 2011.
Taiwanese Office Action for Appl. No. 099305566 dated Jul. 12, 2011.
Notice of Allowance for Design U.S. Appl. No. 29/360,791 dated Jul. 21, 2011.
Notice of Allowance for Design U.S. Appl. No. 29/380,549 dated Jul. 28, 2011.
Office Action with Restriction/Election Requirement for U.S. Appl. No. 12/853,812 dated Sep. 22, 2011.
International Search Report and Written Opinion for PCT Application Serial No. PCT/US2011/41833 dated Oct. 24, 2011.
International Search Report and Written Opinion for PCT Application Serial No. PCT/US2011/043539 dated Oct. 28, 2011.
Notice of Allowance for Japanese Application Serial No. JP-DES 2011/015199 dated Nov. 10, 2011.
Notice of Allowance for Japanese Application Serial No. JP-DES 2011/015200 dated Nov. 30, 2011.
Notice of Allowance for Japanese Application Serial No. JP-DES 2011/015201 dated Nov. 30, 2011.
Notice of Allowance for Taiwanese Application Serial No. TW 099305566 dated Dec. 5, 2011.
Notice of Allowance for Chinese Application Serial No. CN 2011/30171313.0 dated Dec. 6, 2011.
Non-Final Office Action for U.S. Appl. No. 12/853,812 dated Dec. 7, 2011.
International Preliminary Report on Patentability for PCT Application Serial No. PCT/US2010/035379 dated Dec. 8, 2011.
Notice of Allowance for U.S. Appl. No. 29/397,017 dated Dec. 9, 2011.
Certificate of Design Patent for Application No. 2011/015199 dated Dec. 9, 2011.
Non-Final Office Action for Korean Application Serial No. KR 30-2010-0047048 dated Dec. 15, 2011.
Non-Final Office Action for Korean Application Serial No. KR 30-2010-0047049 dated Dec. 15, 2011.
Certificate of Design Patent for Application No. 2011/015200 dated Jan. 6, 2012.
Certificate of Design Patent for Application No. 2011/015201 dated Jan. 6, 2012.
Notification of Grant for Chinese Application Serial No. CN 2011/30210595.0 dated Jan. 17, 2012.
Notification of Grant for Chinese Application Serial No. CN 2010-305787293.2 dated Jan. 19, 2012.
Notice of Allowance for U.S. Appl. No. 29/401,692 dated Jan. 20, 2012.
Notification Concerning Availability of the Publication Serial No. PCT/US2012/024122 dated Aug. 16, 2012.
Notice of Allowance for U.S. Appl. No. 29/403,433 dated Feb. 2, 2012.
International Search Report for Application Serial No. TW 100305347 dated Mar. 5, 2012.
Japanese Notice of Allowance for Application Serial No. JP 2011-017747 dated Mar. 13, 2012.
Communication of European publication number and information on the application of Article 67(3) EPC dated Mar. 14, 2012.
Non-Final Office Action for U.S. Appl. No. 13/082,699 dated Apr. 13, 2012.
Certificate of Design Patent for Chinese Application Serial No. CN ZL 201130171313 dated May 7, 2012.
Notice of Allowance for U.S. Appl. No. 29/397,017 dated May 17, 2012.
Notice of Allowance for U.S. Appl. No. 12/853,812 dated May 21, 2012.
International Search Report and Written Opinion for Application Serial No. PCT/US2011/054560 dated May 22, 2012.
Certificate of Design Patent for Application Serial No. CN ZL 201130210595 dated Jun. 11, 2012.
Certificate of Design Patent for Application Serial No. CN ZL 201030577293 dated Jun. 11, 2012.
International Search Report for Application Serial No. PCT/US2012/023285 dated Jun. 27, 2012.
Supplemental Notice of Allowance for U.S. Appl. No. 29/397,017 dated Jul. 23, 2012.
International Search Report and Written Opinion for Application Serial No. PCT/US2012/024122 dated Jul. 11, 2012.
Korean Office Action for Application Serial No. KR 30-2011-27243 dated Jul. 5, 2012.
Korean Office Action for Application Serial No. KR 30-2011-27244 dated Jul. 5, 2012.
Korean Office Action for Application Serial No. KR 30-2011-27245 dated Jul. 5, 2012.
International Search Report and Written Opinion for Application Serial No. PCT/US2012/021879 dated Sep. 21, 2012.
International Search Report and Written Opinion for Application Serial No. PCT/US2012/036110 dated Oct. 4, 2012.
Notification Concerning Availability of the Publication Serial No. PCT/US2012/023285 dated Aug. 9, 2012.
Korean Office Action for Application Serial No. KR 30-2010-0047049 dated Sep. 12, 2012.

(56) References Cited

OTHER PUBLICATIONS

Hyun-Ho Kim et al., Thermal Transient Characteristics of Die Attach in High Power LED PKG, Microelectronics Reliability, vol. 48, Issue 3, Mar. 2008, pp. 445-454.
Restriction Requirement for U.S. Appl. No. 29/382,394 dated Jul. 17, 2012.
Non-Final Office Action for U.S. Appl. No. 12/825,075 dated Feb. 1, 2013.
Non-Final Office Action for U.S. Appl. No. 13/227,961 dated Mar. 26, 2013.
Non-Final Office Action for U.S. Appl. No. 12/969,267 dated Mar. 29, 2013.
Notice of Allowance for U.S. Appl. No. 13/082,699 dated Apr. 3, 2013.
Korean Notice of Allowance for Application No. 30-2010-0047049 dated Apr. 4, 2013.
Non-Final Office Action for U.S. Appl. No. 13/011,609 dated Jun. 7, 2013.
Non-Final Office Action for U.S. Appl. No. 13/616,759 dated Jul. 11, 2013.
Notice of Allowance for U.S. Appl. No. 12/825,075 dated Jul. 31, 2013.
Notice of Allowance for U.S. Appl. No. 13/462,450 dated Aug. 1, 2013.
Notice of Allowance for U.S. Appl. No. 29/432,988 dated Sep. 10, 2013.
Restriction Requirement for U.S. Appl. No. 29/451,761 dated Sep. 25, 2013.
Notice of Allowance for U.S. Appl. No. 13/227,961 dated Oct. 2, 2013.
Notice of Allowance for U.S. Appl. No. 12/969,267 dated Oct. 2, 2013.
Non-Final Office Action for U.S. Appl. No. 13/616,759 dated Oct. 10, 2013.
Extended European Search Report for Application No. EP 10 78 3782 dated Nov. 22, 2013.
Restriction Requirement for U.S. Appl. No. 13/953,438 dated Dec. 5, 2013.
Japanese Office Action for Application No. 2012-513966 dated Dec. 9, 2013.
Notice of Allowance for U.S. Appl. No. 29/451,761 dated Dec. 11, 2013.
Taiwanese Office Action and Search Report for Application No. 100126672 dated Dec. 26, 2013.
Chinese Office Action for Application No. 2010800304863 dated Jan. 27, 2014.
Taiwanese Office Action for Application No. 101102722 dated Jan. 28, 2014.
Notice of Allowance for U.S. Appl. No. 13/011,609 dated Feb. 20, 2014.
Corrected Notice of Allowance for U.S. Appl. No. 12/969,267 dated Feb. 27, 2014.
Chinese Office Action for Application No. 201080030486.3 dated Mar. 11, 2014.
Japanese Office Action for Application No. 2013-533875 dated Mar. 11, 2014.
Korean Office Action for Application No. 10-2012-7031924 dated Mar. 17, 2014.
Final Office Action for U.S. Appl. No. 13/019,812 dated Mar. 27, 2014.
Chinese Office Action for Application No. 201280014461.3 dated Jan. 4, 2015.
Chinese Office Action for Application No. 201180029228.8 dated Jan. 12, 2015.
Taiwanese Office Action for Application No. 100137044 dated Feb. 24, 2015.
Chinese Decision to Grant for Application No. 201080030486.3 dated Apr. 1, 2015.
Chinese Office Action for Application No. 201180043373. 1 dated Mar. 2, 2015.
Notice of Allowance for U.S. Appl. No. 13/011,609 dated Apr. 14, 2015.
Notice of Allowance for U.S. Appl. No. 14/094,341 dated Apr. 14, 2015.
Chinese Office Action for Application No. 201180041213.3 dated Apr. 7, 2015.
Restriction Requirement for U.S. Appl. No. 13/367,929 dated May 11, 2015.
Chinese Office Action for Application No. 201210068676.5 dated Feb. 15, 2015.
Final Office Action for U.S. Appl. No. 13/836,709 dated Apr. 9, 2015.
Taiwanese Office Action and Search Report for Application No. 101102722 dated Oct. 23, 2014.
Korean Office Action for Application No. 10-2012-7031924 dated Oct. 27, 2014.
Japanese Decision of Rejection for Application No. 2012-513966 dated Oct. 31, 2014.
Japanese Decision of Rejection for Application No. 2013-533875 dated Nov. 25, 2014.
Non-Final Office Action for U.S. Appl. No. 14/174,559 dated Dec. 5, 2014.
Korean Office Action for Application No. 10 2013/7031905 dated Sep. 29, 2014.
Chinese Office Action for Application No. 2010/80030486.3 dated Dec. 17, 2014.
Taiwanese Office Action for Application No. 100137044 dated Jul. 16, 2014.
Chinese Office Action for Application No. 201180041213.3 dated Aug. 4, 2014.
Korean Office Action for Application No. 10-2013-7022968 dated Sep. 19, 2014.
Notice of Allowance for U.S. Appl. No. 13/011,609 dated Oct. 28, 2014.
Non-Final Office Action for U.S. Appl. No. 14/094,341 dated Oct. 31, 2014.
Taiwanese Office Action for Application No. 101102722 dated Apr. 27, 2015.
Korean Decision of Rejection for Application No. 10-2013-7022968 dated May 27, 2015.
Japanese Notice of Completion of Pretrial Reexamination for Application No. 2013/533875 dated May 29 2015.
Chinese Office Action for Application No. 201280021567.6 dated Aug. 25, 2015.
Chinese Office Action for Application No. 201280014461.3 dated Sep. 16, 2015.
Korean Notice of Allowance for Application No. 10-2012-7031924 dated Sep. 23, 2015.
Chinese Office Action for Application No. 2011800412133 dated Oct. 19, 2015.
Chinese Office Action for Application No. 201180043373.1 dated Nov. 12, 2015.
Appeal Decision for Japanese Application No. 2013-533875 dated Sep. 15, 2015.
Taiwanese Notice of Allowance for Application No. 100126672 dated Aug. 26, 2015.
Taiwanese Office Action and Search Report for Application No. 101115615 dated Jun. 4, 2015.
Non-Final Office Action for U.S. Appl. No. 14/174,559 dated Jun. 24, 2015.
Korean Office Action for Application No. 10-2012-7031924 dated Jun. 26, 2015.
Non-Final Office Action for U.S. Appl. No. 13/367,929 dated Oct. 7, 2015.
Final Office Action for U.S. Appl. No. 13/367,929 dated May 9, 2016.
Taiwanese Office Action for Application No. 100137044 dated Aug. 26, 2016.
Chinese Notice of Allowance for Application No. 201180041213 dated Sep. 5, 2016.
Chinese Office Action for Application No. 201180043373 dated Sep. 12, 2016.

(56) References Cited

OTHER PUBLICATIONS

Non-Final Office Action for U.S. Appl. No. 13/367,929 dated Sep. 23, 2016.
Chinese Notice of Allowance for Application No. 201280021567 dated Dec. 28, 2016.
Final Office Action for U.S. Appl. No. 13/367,929 dated Apr. 6, 2017.
Notice of Allowance for Taiwanese Application No. 100137044 dated Mar. 30, 2017.
European Office Action for Application No. 10783782 dated Apr. 5, 2017.
Communication under Article 94(3) EPC for Application No. 10 783 782.5 dated Mar. 9, 2016.
Chinese Office Action for Application No. 2012800215676 dated Feb. 29, 2016.
Japanese Appeal Decision for Application No. 2012-04402 dated Apr. 11, 2016.
Chinese Office Action for Application No. 2011800412133 dated Apr. 15, 2016.
Taiwanese Office Action for Application No. 100137044 dated May 11, 2016.
Chinese Office Action for Application No. 201180043373 dated May 13, 2016.
Chinese Office Action for Application No. 201280021567.6 dated Jun. 24, 2016.
Extended European Search Report for Application No. 11833129 dated Jul. 22, 2016.
Taiwan Notice of Allowance for Application No. 101102722 dated Jul. 25, 2016.
Decision of Rejection for Chinese Application No. 201180043373 dated Jun. 8, 2017.

* cited by examiner

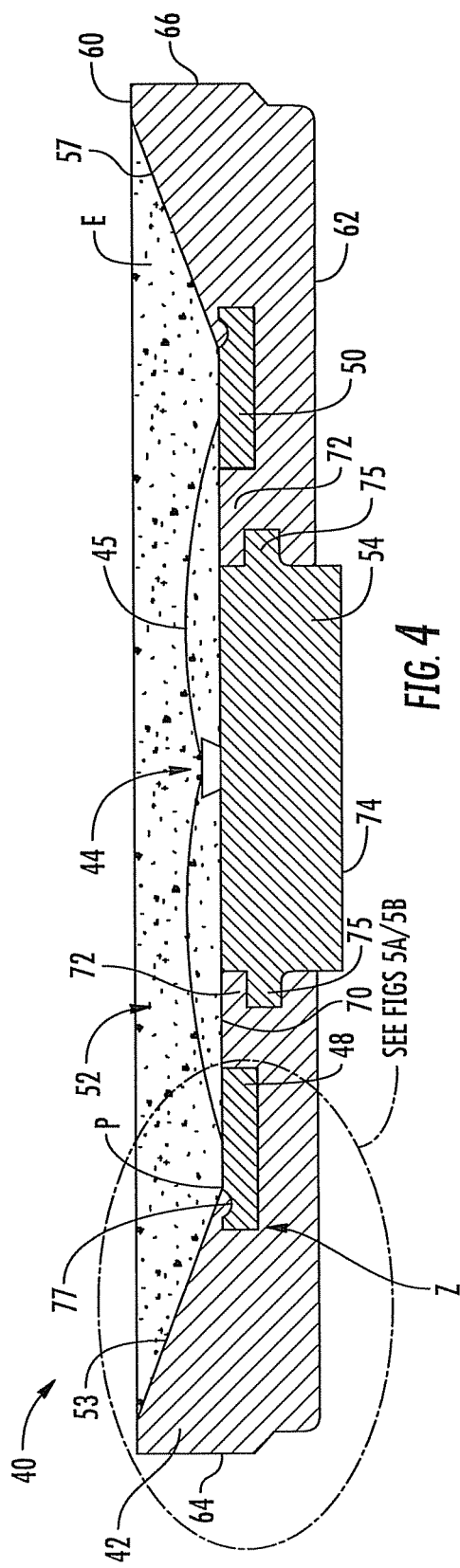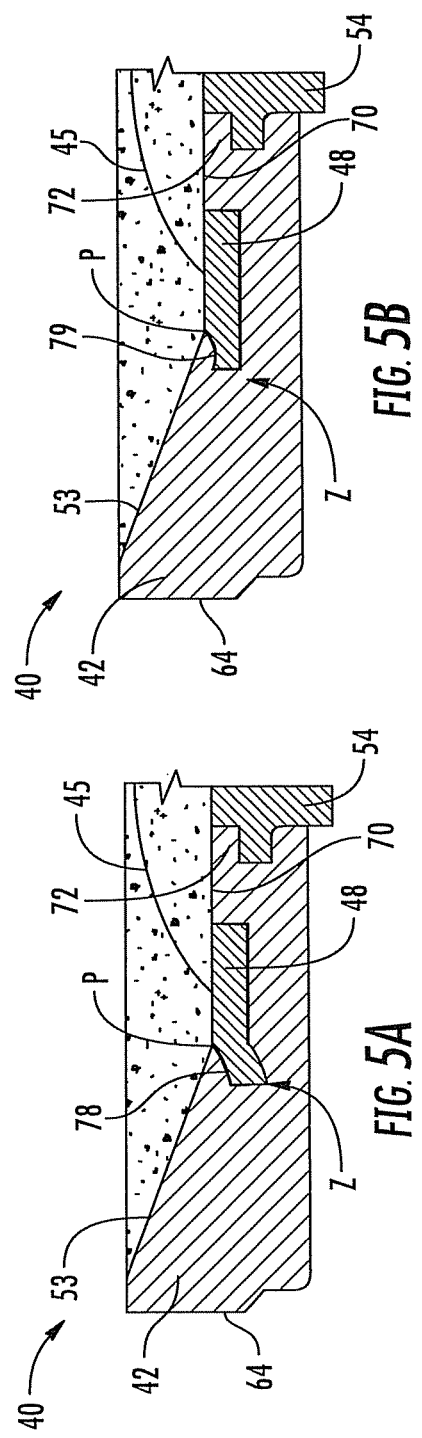

HIGH BRIGHTNESS LIGHT EMITTING DIODE (LED) PACKAGES, SYSTEMS AND METHODS WITH IMPROVED RESIN FILLING AND HIGH ADHESION

CROSS REFERENCE TO RELATED APPLICATION

This application relates and claims priority to U.S. provisional patent application Ser. No. 61/462,248, filed Jan. 31, 2011, the entire contents of which are hereby incorporated by reference herein.

TECHNICAL FIELD

The subject matter disclosed herein relates generally to light emitting diode (LED) packages. More particularly, the subject matter disclosed herein relates to high-brightness LED packages, systems and methods with improved resin filling and high adhesion.

BACKGROUND

Solid state light emitter sources, such as light emitting diodes (LEDs) or LED chips, are widely used in lighting products for commercial and personal use, including, for example, backlighting displays for monitors and televisions. LED chips can be used in the design of compact, thin, energy-saving products having longer lifetimes than conventional lighting products on the market. Products using LED chips require less power to meet the brightness specifications for a given lighting application, thereby significantly reducing energy consumption and the need for active cooling systems. A current trend in packaging LED chips is the use of thinner molded packages for fitting into thin, possibly flat, panel display systems. Thinner packages can, for example, have increased cavity angles to assist in exceeding or maintaining brightness specifications. As cavity angles increase, package material can incompletely mold about package components. For example, package material can incompletely mold about portions of a leadframe. This can lead to gaps, voids, incomplete resin filling, and low adhesion between components within a given package.

Referring to FIGS. 1A and 1B, a prior art LED package having incomplete resin filling is illustrated. FIG. 1A schematically illustrates a cross-sectional view of an LED package, generally designated 10. FIG. 1B is an exploded view of a cavity edge portion of FIG. 1A. LED package 10 can comprise a thin, high-brightness LED package used, for example, in a thin lighting device or panel display system. As packages become thinner, a cavity angle can increase to maintain or exceed brightness levels in part by increasing surfaces from which light can be reflected. LED package 10 can comprise a body 12 molded about one or more electrical elements, for example, first and second electrical leads 14 and 16, respectively. At least one LED or LED chip, generally designated 18 can be disposed over a thermal element 20 of the package 10 and electrically communicate to the electrical elements using one or more wirebonds 22. A cavity can be formed in the body, and the cavity can comprise a cavity floor 24 and at least one cavity wall 26 extending around the cavity floor 24 such that the cavity surrounds the at least one LED 18. Cavity angle θ measures the angle between opposing sides of the cavity wall 26, the opposing sides can extend around the cavity floor and at least one LED chip 18. First and second electrical leads 14 and 16 can be disposed along a same plane as cavity floor 24, that is, electrical leads and cavity floor 24 can be flush and/or flat.

As best illustrated by the exploded view in FIG. 1B, cavity wall 26 and electrical element meet at a point P. During molding of body 12, a viscous plastic resin can be restricted from flowing into such a tight space formed at and/or adjacent point P and can incompletely fill an area adjacent point P as indicated by the solid area, generally designated 28. That is, area 28 can comprise an area of "plastic non-filling" such as a void or gap where resin cannot and/or does not flow into, and which can run at least partially along a length of the cavity wall adjacent electrical lead 14. This is undesirable as it decreases adhesion between the plastic body 12 and electrical lead 14. Electrical lead 14 may be inadequately secured within body 12 and can lead to various types of failures during operation of package 10. For example, if the electrical lead 14 shifts or moves within the package it can cause one or more wirebonds 22 to break. In addition, encapsulant or other optical material could leak out from the cavity and into the voided areas, which could interfere with light emission of the package body. Further defects can include cosmetic issues, for example, producing pattern recognition errors during production, for example during LED chip die bonding and/or wire bonding. Such leakage can also affect color point stability. Also, the inconsistent surface can make automated process steps such as die attach difficult due to pattern recognition errors.

FIG. 2 illustrates a prior art solution for resolving the problem of plastic non-filling. FIG. 2 illustrates an LED package 30 having similar features as described in FIGS. 1A and 1B, but removing a portion of the body such that a ledge, or step 32 is formed at the base of cavity wall 26. That is, cavity wall 26 does not extend in a continuous line to meet first and second electrical leads 14 and 16 at point P. Rather, cavity wall 26 extends along a continuous line until it is positioned over the electrical leads and then it descends in a substantially vertical line vertically stepping down to fit against electrical leads 14 and 16. This can decrease the amount of plastic non-filling by eliminating the tight, triangular area 28 of non-filling illustrated in FIGS. 1A and 1B. However, the brightness of LED package 30 is decreased because of step 32. A portion of the reflective surface has been removed, thus, package brightness can decrease due to the very small cup angle around the base of the cavity wall 26. Valuable reflective surfaces are is lost because of the vertical drop, and removal of at least a portion of the body.

Thus, despite the availability of various LED packages in the marketplace, a need remains for LED packages, systems and methods with improved resin filling and high adhesion while maintaining a high-brightness.

SUMMARY

In accordance with this disclosure, high-brightness LED packages, systems and methods are provided. It is, therefore, an object of the present disclosure herein to provide novel high-brightness LED packages, systems and methods with improved resin filling and high adhesion.

These and other objects of the present disclosure as can become apparent from the disclosure herein are achieved, at least in whole or in part, by the subject matter described herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which:

FIG. 4 illustrates a cross-sectional view of one embodiment of a high-brightness LED package with improved resin filling and adhesion according to the subject matter herein;

FIGS. 5A and 5B illustrate portions of cross-sectional views of other embodiments of high-brightness LED packages with improved resin filling and adhesion according to the subject matter herein;

DETAILED DESCRIPTION

Figure 1:
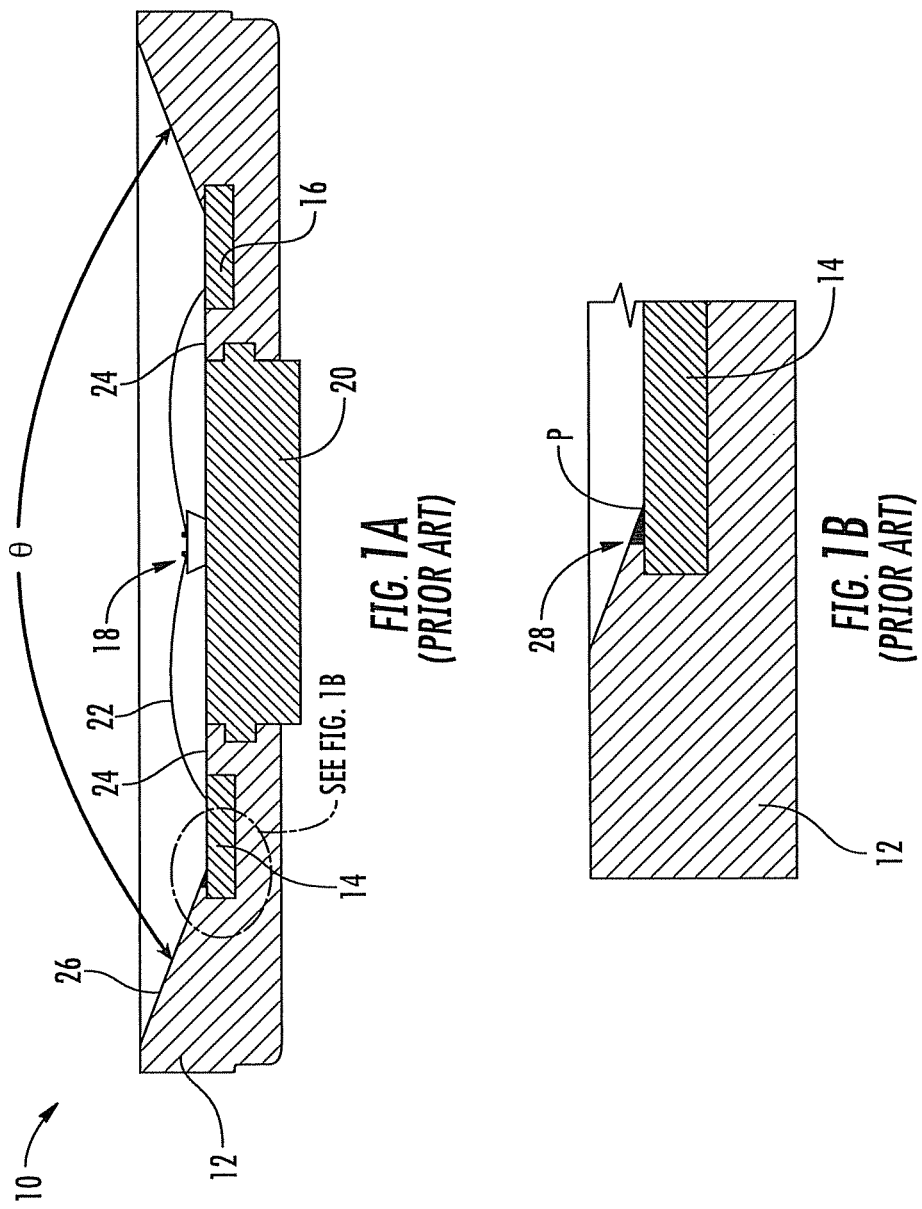
FIG. 1A illustrates a cross-sectional view of an embodiment of a light emitting diode (LED) package with incomplete resin filling.
FIG. 1B illustrates an exploded view of an embodiment of an LED package with incomplete resin filling.
Figure 2:
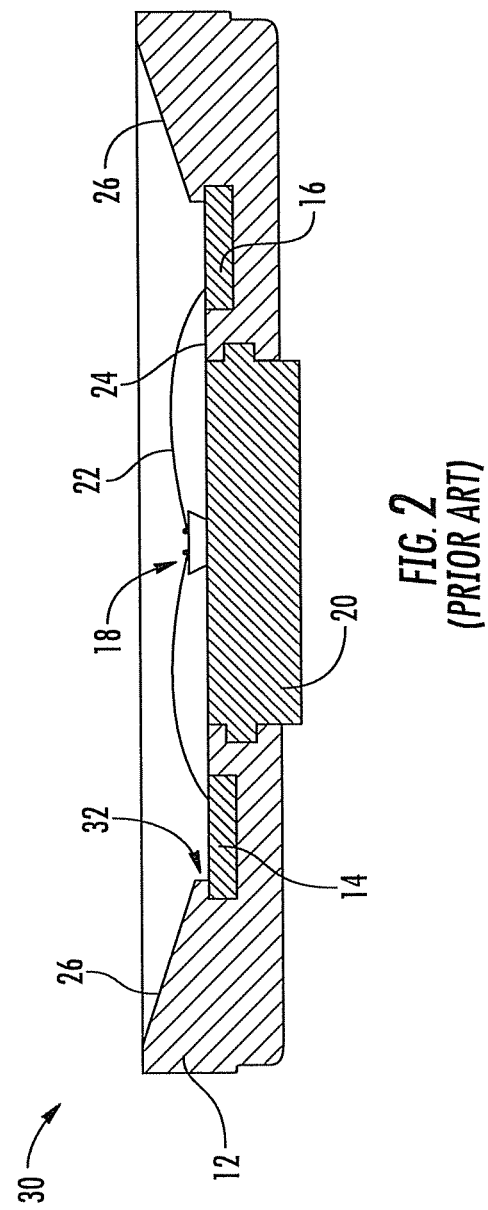
FIG. 2 illustrates a cross-sectional view of a prior art LED package.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Unless the absence of one or more elements is specifically recited, the terms "comprising," including," and "having" as used herein should be interpreted as open-ended terms that do not preclude the presence of one or more elements.

Light emitters or light emitting devices according to embodiments described herein can comprise group III-V nitride (e.g., gallium nitride (GaN)) based light emitting diode (LED) chips or lasers that can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si) and GaN. In one aspect. SIC substrates/layers can be 4H polytype silicon carbide substrates/layers. Other Sic candidate polytypes, such as 3C, 6H, and 15R polytypes, however, can be used. Appropriate SIC substrates are available from Cree. Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as AlxGa1-xN where 1>x>0 are often used to describe these compounds. Techniques for epitaxial growth of Group III nitrides have become reasonably well developed and reported in the appropriate scientific literature.

Although various embodiments of LED chips disclosed herein comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LEDs or LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED). Moreover, the growth substrate can be maintained on the LED after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wire bonded. A vertical device (with or without the growth substrate) can have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

As described further, one or more LED chips can be at least partially coated with one or more phosphors. The phosphors can absorb a portion of the LED chip light and emit a different wavelength of light such that the LED device or package emits a combination of light from each of the LED chip and the phosphor. In one embodiment, the LED device or package emits what is perceived as white light resulting from a combination of light emission from the LED chip and the phosphor. One or more LED chips can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. patent application Ser. No. 12/014,404 entitled "Phosphor Coating Systems and Methods for Light Emitting Structures and Packaged Light Emitting Diodes Including Phosphor Coating" and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that LED devices, systems, and methods according to the present subject matter can also have multiple LED chips of different colors, one or more of which can be white emitting.

Referring now to FIGS. 3 to 22 of the drawings, embodiments of high-brightness LED packages, systems and methods with improved resin filling and high adhesion are illustrated. FIGS. 3 to 10 illustrate components of LED package, generally designated 40. LED package 40 can provide a body or housing for one or more light emitters including one or more LEDs or LED chips. Referring to these figures. LED package 40 can comprise a body structure, or body 42, housing one or more LEDs or LED chips, generally designated 44, arranged over an upper surface of a thermal element described further herein. An electrostatic discharge (ESD) protection device 46 can be disposed in the LED package 40 to protect it from ESD damage. In one aspect. ESD protection device 46 can comprise a Zener diode, ceramic capacitor, transient voltage suppression (TVS) diode, multilayer varistor, a Shottky diode, a different LED arranged reverse biased to the one or more LED chips 44, and/or any other suitable ESD protection device known in the art. ESD protection device 46 can be mounted over an electrical element and electrically connected to a second electrical element of a different electrical polarity. LED chips 44 and ESD protection device 46 can electrically communicate with electrical elements such as for example by the use of one or more wirebonds 45. For example, first and second electrical elements can comprise first and second electrical leads 48 and 50, respectively. One of first and second electrical leads 48 and 50 can comprise an anode, and the other a cathode for allowing electrical signal, or current, to flow into the LED package and illuminate the one or more LED chips 44 when connected to an external circuit or other suitable source of electrical current. First and second electrical leads 48 and 50 can be formed of any suitable electrically conductive material. In one aspect, first and second electrical leads 48 and 50 can be formed from a leadframe comprising a single metal and/or layers of metals, for example including but not limited to, silver, copper, platinum, nickel, and/or any combination thereof.

Figure 8:
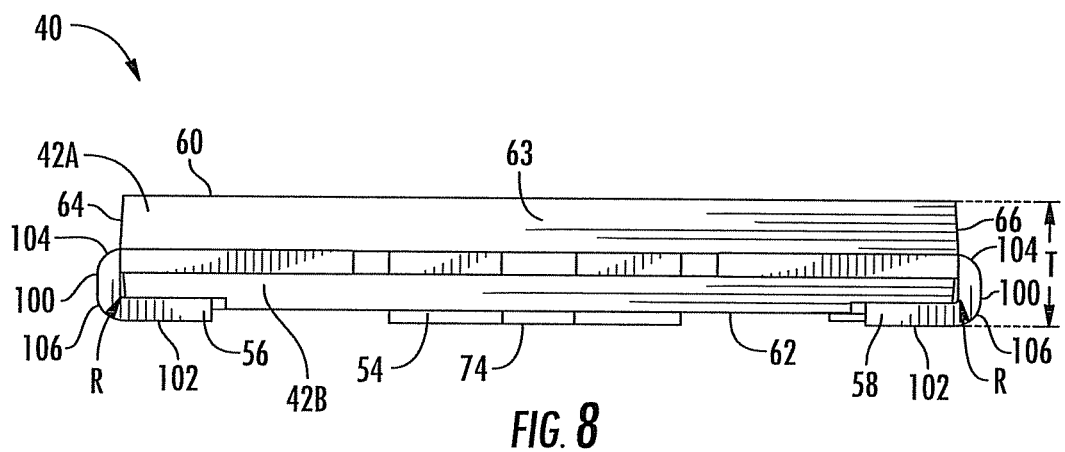
FIG. 8 illustrates a side view of an embodiment of an LED package according to the subject matter herein.

Body 42 can be advantageously formed using a molding process, such as injection molding, using a thermoplastic and/or thermoset material that can be electrically insulating. Polymer-containing materials can be used to form the body 42, with such materials optionally being reinforced (e.g., with fibers, ceramics, or composites). Body 42 can be white or light in color to minimize dark appearance of the overall package. As an alternative to injection molding, other types of molding and/or forming processes (e.g., sintering) may be used. Body 42 can comprise an upper portion 42A and lower portion 42B (e.g., as may be formed in upper and lower molding die portions (not shown), respectively). A cavity, generally designated 52 can be disposed about electrical elements and at least one thermal element as the inverse of a central protrusion in an upper molding die. In one aspect, cavity 52 can comprise a reflector cavity from which light can be reflected from the one or more LED chips 44. A thermal element can comprise a thermal heat transfer material 54 over which the one or more LED chips 44 can be directly and/or indirectly mounted. As FIG. 8 illustrates, lower portion 42B can taper inwardly and away from the external portions of the metal leads, for example, one or more first external portions 56 corresponding to first electrical lead 48 and one or more second external portions 58 corresponding to second electrical lead 50.

Body 42 can comprise a body of any suitable material, such as a body selected from a group of materials consisting of molded plastic, polymeric, thermoset plastic, thermoplastic, ceramic, nylon, liquid crystal polymer (LCP), or polyvinyl chloride (PVC) wherein body 42 can be disposed about thermal and electrical elements. In one aspect, body 42 can comprise a white plastic material, more specifically, a molded white plastic material. In one aspect, body 42 can comprise any suitable moldable material. In another aspect, body 42 can comprise a plastic material having quantitative and qualitative properties improved or improved for solid state device package applications. The plastic material can in one aspect comprise, for example, any suitable organic polymer, such as for example a heat resistant resin such as a polyamide resin. The plastic material can optionally be filled with glass or mineral material for strength and something like titanium dioxide for reflectivity.

Utilizing a plastic material such as described herein for body 42 of package 40, and other packages disclosed herein can allow for an advantageous softness for body 42 at operating temperatures as hardness can depend upon temperature. This softness allows body 42 to desirably have improved reliability and useful lifetime. The plastic material can in one aspect be a liquid crystal polymer (LCP). An improved plastic material in accordance herewith can have a glass transition temperature ($T_g$) that can, for example, be greater than approximately 110 degrees Celsius (° C.). The glass transition temperature ($T_g$) can, for example, be greater than approximately 115° C. or greater than approximately 120° C. In one aspect, the glass transition temperature ($T_g$) can be greater than approximately 123° C. The improved plastic material in accordance herewith can also comprise a melting point temperature ($T_m$) that can be less than approximately 315° C. The melting point temperature ($T_m$) can, for example, be less than approximately 310° C. The melting point temperature ($T_m$) can, for example, be less than approximately 300° C. In one aspect, the melting point temperature ($T_m$) can be approximately 307° C. A plastic material with a $T_g$ of approximately 123° C. is higher than many plastics conventionally used and can allow the package to have increased stability at elevated temperatures. A plastic material with a lower $T_m$ of approximately 307° C. can allow better flowability because the melting temperature is lower than that of plastics conventionally used and the plastic body is easier to mold. The plastic selected for body 42 can also comprise improved qualitative properties. For example, a white plastic material can be chosen which exhibits a better reflectivity retention value while also exhibiting fewer tendencies to discolor, degrade, and/or yellow when subjected to heat and/or light exposure. The reflectivity of the plastic material can in one aspect be greater than 90% for example, and that level or another level of high reflectivity can be maintained over time, heat, moisture, and blue light exposure.

Other characteristics or features of the plastic material for body 42 can comprise an elongation value (mechanical property) of approximately 1.4% or greater, or an elongation value of 1.6% or greater. In one aspect, the elongation value can be approximately 1.5% or greater. Also as a mechanical property, the flexural strength of the plastic material of body 42 as measured by ASTM D790 standards can be approximately 150 MPa or lower, approximately 130 MPa or lower, or approximately 120 MPa or lower. In one aspect, the flexural strength of the plastic material of body 42 can be approximately 140 MPa or lower as measured by ASTM D790 standards. Also as a mechanical property, the flexural modulus of the plastic material of body 42 can be approximately 6.9 GPa or lower, or approximately 6.5 GPa or lower. In one aspect, the flexural modulus of the plastic material of body 42 can be approximately 6.0 GPa or lower. As yet another mechanical property, the tensile strength of the plastic material of body 42 can be approximately 100 MPa or lower as measured by ASTM D638 standards, approximately 90 MPa or lower, or approximately 80 MPa or lower. In one aspect, the tensile strength of the plastic material of body 42 can be less than approximately 75 MPa as measured by ASTM D638 standards.

Still referring to FIGS. 3 to 10, body 42 can comprise an upper surface 60, a lower surface 62 and one or more lateral and exterior side walls. A sign or indicator can be disposed in at least one portion of upper surface 60 to indicate the polarity of the package. For example, a notch N can be disposed in an upper corner to indicate the cathode and/or anode side of LED package 40 and can also be useful in processing if desired. In one aspect, body 42 can comprise four lateral walls 63, 64, 65, and 66. Lateral walls 63-66 can comprise the same or different lengths. In one aspect, lateral walls can form a substantially square, rectangular, circular, or any other suitably shaped package body 42 and corresponding footprint. For illustration purposes, a rectangular package 40 is illustrated wherein opposing lateral walls comprise substantially the same length. For example, first lateral wall 63 and opposing third lateral wall 65 can comprise substantially the same or similar length which can be longer than one or more adjacent lateral walls. Likewise, second lateral wall 64 and opposing fourth lateral wall 66 can comprise substantially the same or similar length which can be shorter than one or more adjacent lateral walls. Second and fourth lateral walls 64 and 66, respectively, can be disposed and adjacent first and third lateral walls 63 and 65, respectively.

Body 42 can, as mentioned previously, further define reflector cavity 52. Reflector cavity 52 can comprise substantially the same shape as lateral walls 63-66 or any other suitable shape. For example, reflector cavity 52 can comprise a substantially square, rectangular, circular, or any other suitably shaped cavity. For illustration purposes only and without limitation, reflector cavity 52 is shown as a substantially rectangular cavity having substantially curved corners 68 connecting one or more adjacent walls. Corners 68 could optionally comprise substantially squared corners or any other suitable shape. Reflector cavity 52 can comprise two opposing walls that can be longer in length than adjacent walls. Reflector cavity 52 can be defined at the upper surface 60 of body 42 and can extend to a lower floor of the body. The lower floor of the body can be disposed inside the body and can comprise a cavity floor 70. Reflector cavity can be disposed or inclined at an angle between the upper surface 60 and cavity floor 70. Cavity floor 70 can be substantially flush with thermal and electrical elements, or can be at least partially disposed above and/or below such elements. Cavity floor 70 can comprise a portion of body 42 which can be configured in any suitable configuration to electrically and/or thermally isolate portions of the thermal and electrical elements. In one aspect, the thermal element can be fully electrically and/or thermally isolated from electrical elements. Specific dimensions of body 42 are illustrated and discussed with respect to FIG. 14 below.

Figure 3:
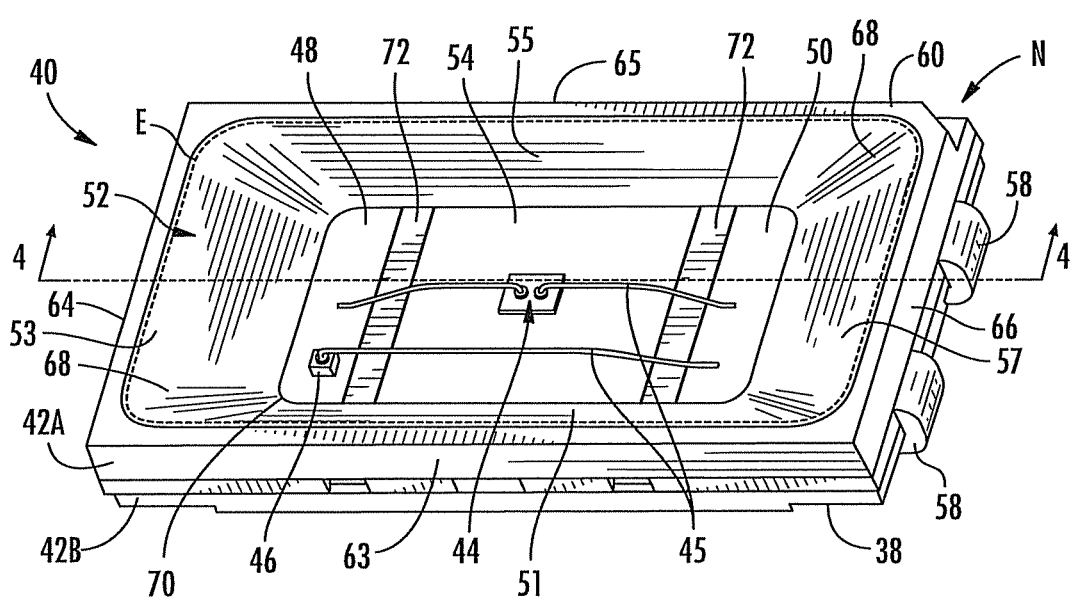
FIG. 3 illustrates a top perspective view of an embodiment of an LED package according to the subject matter herein.

Referring to FIGS. 3-10, LED package 40 can comprise one or more electrical and thermal elements. Electrical elements can comprise electrical leads 48 and 50 which can further comprise integrally formed and extending, external portions 56 and 58. The thermal element can comprise a heat transfer material 54 or a heat transferring substrate, such as for example a heat slug disposed on a bottom floor of reflector cavity 52 of package body 42. Reflector cavity 52 can optionally be coated with a reflecting substance and/or filled to a desired level with an encapsulant E. In FIG. 3, the dotted line illustrates a first level to which encapsulant E may be filled within reflector cavity 52. That is, encapsulant E can be filled to a level substantially flush with the top of reflector cavity 52, or in the alternative it may be filled to any suitable level within reflector cavity 52 and can comprise a concave or convex surface and even exceed or extend above reflector cavity 52 as known in the art. Encapsulant E can comprise any suitable material known in the art and can optionally comprise a phosphor or a lumiphor to interact with light emitted by the LED chips 44 and responsively emit light of a different wavelength spectrum.

Heat transfer material 54 can comprise a single metal, an alloyed metal, and/or combinations or layers thereof. Heat transfer material 54 can comprise any suitable thermally conducting material known in the art. Heat transfer material 54 can be formed integrally as one piece or, in the alternative it can comprise several portions, for example, a protruding portion 194 (FIG. 19A) attached to and extending from a base portion of thermally conducting material assembled together as known in the art. Heat transfer material 54 can comprise any suitable type of heat transfer device. In one aspect, heat transfer material 54 can be an intermediary thermal structure for transferring heat to another structure such as a heat transfer layer or a heat sink of an external source (not shown) for further heat dissipation. External sources can comprise, for example, a PCB, metal-core printed circuit board (MCPCB), or other suitable source or substrate. In some aspects, external source can comprise a substrate of a backlighting system or other display panel system such as illustrated in FIGS. 20-22. In one aspect, heat transfer material 54 can comprise a thermal structure with limited heat capacity and capable of heating up quite quickly if not effectively connected thermally to a further heat transfer device such as an actual heat sink.

Wirebonding the LED chips 44 and ESD protection device 46 using one or more conducting wires 45 can electrically connect the LED chips 44 and ESD protection device 46 to electrical elements. In some aspects. LED chips 44 and ESD protection device 46 can be reverse wirebonded for facilitating thinner packages and packages having shallower reflector cavity depths contributing to thinner packages. Heat transfer material 54 can be at least partially electrically and/or thermally isolated from electrical elements of the package. In one aspect, heat transfer material 54 can be fully electrically and/or thermally isolated from metal leads 48 and 50 by one or more insulating portions 72 of body 42. Insulating portions 72 can be comprise at least a portion of cavity floor 70. In one aspect, insulating portions 72 are flush with the electrical and thermal elements across the cavity floor 70. An exposed lower surface 74 (FIGS. 4, 8, 10) of heat transfer material 54 can extend from the lower surface 62 of body 42. Exposed lower surface 74 can be flush with lower surfaces of external portions of metal leads 48 and 50. Heat transfer material 54 can conduct heat away from LED chips 44 and LED package 40 thereby allowing improved heat dissipation therefrom. In one aspect, the one or more LED chips 44 can be mounted on an optional submount (not shown) disposed between the LED chips 44 and heat transfer material 54.

FIGS. 4 to 5B illustrate a cross-sectional view of LED package 40 comprising improved features for improving resin filling and adhesion of the package body while maintaining brightness. For example, FIG. 4 illustrates a cross-sectional view of LED package 10 along 4-4 of FIG. 3 of LED package 40. A portion of the electrical elements in FIGS. 4 to 5B has been bent and/or removed such that it is positioned a distance away from the cavity floor 70 and a point P. Point P can comprise an intersection area of where one or more cavity walls 51, 53, 55, and/or 57 extends towards and intersects cavity floor 70. FIGS. 4 to 5B illustrate cavity walls 53 and 57 of reflector cavity 52 extending down to meet cavity floor 70. FIG. 3 also illustrate a rectangular cavity having four cavity walls 51, 53, 55, and 57 extending around and/or towards the cavity floor 70. In some aspects, such as for example circular cavities, only one cavity wall may exist. For illustration purposes, cavity 52 is illustrated as a rectangular cavity having more than one cavity wall, however, any size and/or shape of cavity may be used and therefore any number of cavity walls is contemplated herein. Cavity walls 53 and 57 can intersect the cavity floor 70 at point P, and point P can extend about the cavity floor 70, for example, around L4 and W3 of FIG. 15 forming areas of intersection of the cavity walls and floor. In conventional packages, for example, that of LED package 10 in FIG. 1A, the area adjacent point P is narrow and constricted such that plastic resin cannot flow into it during the molding process. As illustrated by FIGS. 4 to 5B, packages having improved resin filling and adhesion are disclosed, such that areas adjacent point P are configured to allow plastic resin to more easily flow into the area during the molding process. FIGS. 4 to 5B (and FIGS. 6 and 11 described further herein) can comprise electrical elements with one or more outer zones, generally designated Z and shown for illustration purposes as designated areas with lines hatched therethrough, which can comprise a predetermined form or configuration proximate the reflector cavity 52 such that the molded body material can more readily flow adjacent the electrical elements and increase adhesion of package components. Zones Z can comprise a portion of the leadframe to be removed and/or configured to be located on a different plane than the cavity floor while first and second electrical leads 48 and 50 can be disposed on a same plane of the cavity floor.

In one aspect, cavity floor 70 can be flush with an upper surface of heat transfer material 54. In one aspect, cavity floor 70 can be flush upper surfaces of first and second electrical leads 48 and 50, respectively. In one aspect, cavity floor 70 can be flush with each upper surface of the electrical and thermal elements. Encapsulant E can be disposed to any suitable level within reflector cavity 52 and encapsulant E can optionally containing optical materials such as phosphors and/or lumiphors. For illustration purposes, encapsulant E is shown as substantially flush with an upper surface 60 of body 42 and the top of the reflector cavity 52, but it can be filled to any level above and/or below the top of reflector cavity 52 and can comprise a convex or concave surface as may be desired.

Also illustrated in FIG. 4 is heat transfer material 54 which can be disposed at least partially between electrical leads 48 and 50. In other aspects, heat transfer material 54 can be disposed in any suitable configuration with respect to electrical leads 48 and 50. Electrical leads 48 and 50 can be stamped and can have thinner members than heat transfer material 54. In one aspect, heat transfer material 54 can have a thickness extending from cavity floor 70 and through the entire lower portion 42B of LED package 40. Heat transfer material 54 can extend through from the lower surface 62 of LED package 40 and can extend to a plane parallel with bottom surfaces of linear portions 102 (FIG. 8) of first and second electrical leads 48 and 50, respectively. In one aspect, heat transfer material 54 can have a thickness of 0.5 millimeters (mm). In one aspect, the thickness T of the package can comprise less than approximately 0.9 mm. Thus, heat transfer material 26 can be less than approximately 55 to 60% of the package thickness thereby maintaining good thermal management properties. In other aspects, heat transfer material 54 can be less than approximately 50% of the package thickness. Heat transfer material 26 can comprise at least one lateral protrusion 75 that can be defined along a lateral wall. Lateral protrusion 75 can be disposed adjacent electrical elements, as for example, adjacent first and second electrical leads 48 and 50, respectively. In one aspect, heat transfer material 54 can comprise opposing lateral protrusions 75 defined along opposing lateral walls such that the protrusions extend into body portion 42. Lateral protrusions 75 can promote secure retention of heat transfer material 54 by body 42 and can also reduce the potential for leakage, for example of solder flux during assembly of the LED package 40 to an MCPCB, or of encapsulant E disposed in reflector cavity 52 during operation of LED package 40 along interfaces between body 42 and heat transfer material 54. Such protrusions 75 along side walls of heat transfer material 54 may be varied in number, size, shape, and orientation (e.g. angled upward or downward, e.g., FIGS. 19A and 19B) or could be curved. Heat transfer material 54 can be at least partially, electrically and/or thermally isolated from first and second electrical leads 48 and 50, respectively. For illustration purposes, FIG. 4 illustrates heat transfer material 54 as fully electrically isolated and separated from first and second electrical leads 48 and 50 by one or more isolating portions 72 of body 42.

FIGS. 4 to 5B illustrate one or more zones Z disposed at one edge of electrical elements, for example, at one edge of first and second electrical leads 48 and 50, respectively. Zones Z can comprise a predetermined form or configuration adapted to extend a distance away from one or both of point P and cavity floor 70 thereby allowing body material to more readily flow into the area adjacent point P during the molding process. Thus, adhesion strength between metal and plastic resin of the package can be increased and areas of non-plastic filling can be significantly reduced and/or eliminated. In one aspect, zone Z can be at least partially disposed below the cavity floor 70. For example, FIG. 4 illustrates an upper surface 77 disposed along an edge of first electrical lead 48 which forms a recess, crater, or crevice. The edge surface can be curved such that it extends below a plane of cavity floor 70 and a distance away from point P. The distance away from point P can be measured by measuring the height of the recess (not shown). One or both of electrical leads 48 and 50 can comprise upper surfaces 77. Upper surface can be formed using any suitable process. In one aspect, upper surface 77 can be created by etching, stamping, bending, and/or machining electrical leads 48 and 50.

FIGS. 5A and 5B also illustrate electrical elements, for example, at least one electrical lead 48 comprising zones Z extending a distance away from point P and/or and cavity floor 70. Electrical elements of FIGS. 4 to 5A comprise areas or gaps disposed between point P and a portion of the electrical elements. FIGS. 4 to 5A also illustrate at least a portion of the electrical elements positioned away from the cavity floor and point P. FIG. 5A illustrates an upper surface 78 disposed at an edge of electrical lead 48. Upper surface 78 can extend away from point P thereby allowing more room for plastic or resin body material to flow into during the molding process. In one aspect, upper surface 78 can incline, or slope along a linear line such that at least a portion of electrical lead 48 is located on a different plane from cavity floor 70. In one aspect, at least a portion of electrical lead can be disposed on a plane below the plane of the cavity floor 70. Upper surface also can extend such that it is located a distance away from point P, and the distance can be measured by the length of upper surface 78. Similarly, FIG. 5B illustrates a combination of FIGS. 4 and 5A. That is, FIG. 5B illustrates an upper edge 79 of electrical lead 48 which extends away from cavity floor and point P and can be a curved and/or recessed surface. Upper surfaces 78 and 79 illustrated in FIGS. 5A and 5B can be formed and/or positioned away from point P and cavity floor 70 using any suitable process, such as, but not limited to etching, stamping, bending, and/or machining. Upper surfaces 77-79 are not limited to those shown but can comprise any suitable size, shape, and/or length configured for increasing the volume adjacent point P. Upper surfaces 77-79 can be spaced apart from the lower floor of the body such that a gap may be disposed between the surfaces and the lower, or cavity floor. This can allow plastic or resin material of the body to more readily flow into the area adjacent point P during the molding process, thereby increasing adhesion of the metal and plastic package components and decreasing and/or eliminating voided areas or areas of plastic non-filing. Notably. LED package 40 can maintain or exceed its brightness levels as the reflector cavity can fully extend between upper surface 60 of LED package and cavity floor 70. The reflector cavity does not need to be cut off, thereby reducing the amount and quality of surfaces available to reflect light.

In one aspect, as illustrated by FIGS. 4 to 5B, electrical elements 48 and 50 can comprise first and second surfaces proximate point P. The first surface can comprise an upper surface disposed on a first plane, for example, a same plane as the cavity floor 70. The second upper surfaces 77, 78, and/or 79 of electrical elements 48 and 50 can be at least partially disposed on a second plane that is different from the first plane. The body can at least substantially cover the second surface, thereby filling the area adjacent point P and improving adhesion between the plastic body and electrical leads. The second surfaces 77, 78, and/or 79 of electrical elements 48 and 50 can be disposed internal body 42 adjacent and/or proximate point P. In one aspect, the second plane can be disposed below the first plane. That is, second surfaces 77, 78, and/or 79 of the electrical leads 48 and 50 can extend away from and below the intersection area and/or cavity floor 70 of the body. Electrical elements can be bent at the edges between the metal and the plastic resin and/or etched with craters around the edge. In another aspect, the electrical elements can be etched to mimic bent leads.

Packages having improved resin filling and increased adhesion between metal and plastic components can comprise a plastic molded device with bent and/or etched electrical leads around the edge between the metal and plastic resin. Packages disclosed in FIGS. 3 to 22 herein can have several advantages which can include complete plastic resin filling. This can facilitate the stable, repeatable, manufacture or production of packages having large cavity angles. In addition, as the cavity angle is larger, the brightness tends to be higher. Packages disclosed herein can maintain the high brightness while resolving the intrinsic problem of manufacturing packages with large cavity angles.

Figure 6:
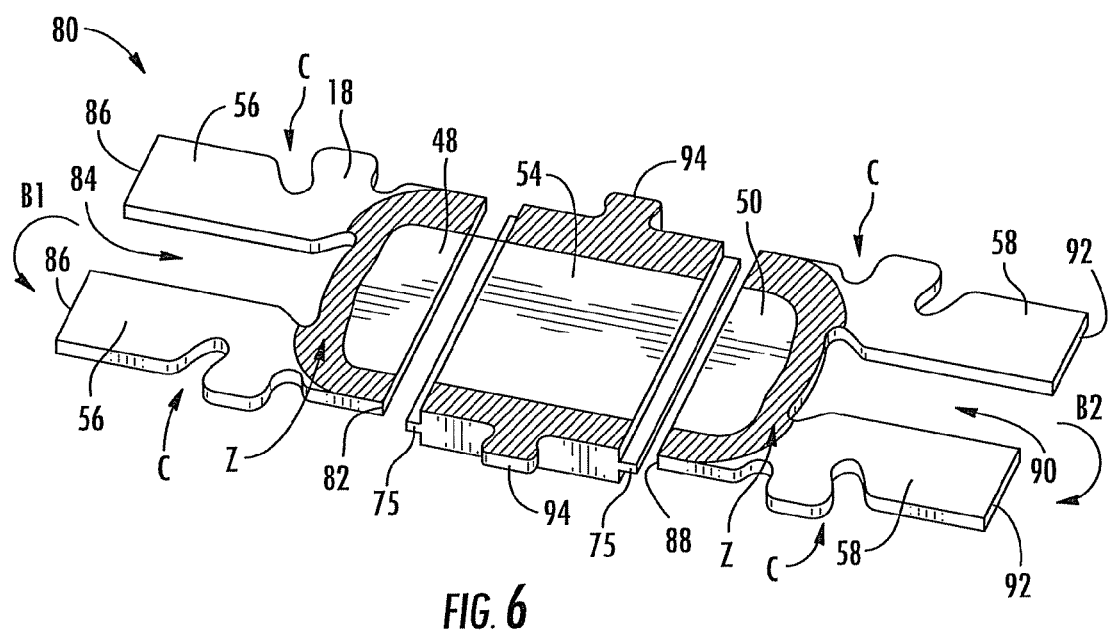
FIG. 6 illustrates a perspective top view of leads that can be used in an LED package according to one aspect of the subject matter herein.

FIG. 6 illustrates one embodiment or configuration of leads that can be used, generally designated 80, for use with LED package 40 and/or other packages described herein. Leads 80 can be disposed, and in some aspects molded, within LED package 40. Leads 80 can comprise at least one thermal element and one or more electrical elements. The thermal element can comprise heat transfer material 54, and the electrical elements can comprise first and second electrical leads 48 and 50, respectively. FIG. 6 illustrates heat transfer material 54 disposed at least partially between first and second electrical leads 48 and 50, however, any suitable arrangement is contemplated. First and second electrical leads 48 and 50 can extend outwardly from a proximal edge into one or more external portions 56 and 58. For example, first electrical lead 48 can comprise a proximal edge 82 disposed adjacent to heat transfer material 54. First electrical lead 48 can extend about a first aperture 84 thereby forming at least two external portions 56. First electrical lead can extend about multiple apertures 84 thereby forming a plurality of external portions 56. Each of external portions 56 can bend externally in a direction indicated by the arrow B1 into a vertical portion perpendicular a linear portion as later described in FIG. 8, for example forming a J-bend configuration bending inwardly towards the lower surface of heat transfer material 54. External portions 56 can comprise distal ends 86 distally located from heat transfer material 54 which can be sheared or otherwise singulated from a sheet of metal comprising a plurality of leads 80.

Similarly, second electrical lead 50 can comprise a proximal edge 88 disposed adjacent to heat transfer material 54. Second electrical lead 50 can extend about a second aperture 90 thereby forming at least two external portions 58. Second electrical lead 50 could extend about multiple apertures 90 thereby forming a plurality of external portions 58. Each of external portions 58 can bend externally in the direction indicated by arrow B2 into a vertical portion perpendicular a linear portion as will be described with respect to FIG. 8, such as forming a J-bend configuration bending inwardly towards the lower surface of heat transfer material 54. Such bending of external portions 56 and/or 58 can be performed after forming of the body structure. External portion 58 can comprise distal ends 92 distally located from heat transfer material 54. Heat transfer material 54 can comprise one or more terminating ends 94 which can be sheared or otherwise singulated from a sheet of leads 80. Terminating ends 94 of heat transfer material 54 can be sheared substantially flush with lateral walls, for example, walls 63 and 65 of LED package 40.

FIG. 6 also illustrates one or more transitional zones Z disposed at an edge of the leadframe adjacent apertures 84 and 90 where the first and second electrical leads begin to extend around the first and second apertures 84 and 90. Zones Z illustrated here are illustrated by the shaded lines, and can be etched, stamped, bent, and/or machined to form any of the upper surfaces 77-79 described and illustrated by FIGS. 4 to 5B. Zones Z are configured for preconfiguring and positioning inside the body, and zones Z can comprise any suitable configuration and can be formed using any suitable process. Zones Z can be adapted to increase an area adjacent a point P of LED package 40 to enable material to better adhere to the leadframe and fill areas adjacent first and second apertures 84 and 90. In one aspect, zones Z can be configured to extend away from cavity floor 70 (FIGS. 4 to 5B) such that at least a portion of electrical leads 48 and 50 can be below cavity floor 70 and extended in distance away from cavity floor 70 and/or point P. First and second electrical leads 48 and 50 can also comprise curved perimeters, or profiles generally designated C. Curved profiles C can further improve adhesion of the body to the leadframe during the molded process, much like lateral protrusions 75 can improve adhesion between the body and heat transfer material 54 as previously described. As shown for example in FIG. 6, zones Z can be disposed on electrical elements 48 and 50 and can also be disposed on heat transfer material 54. For example, heat transfer material 54 can comprise zones Z that can be disposed on opposing portions of the same surface of heat transfer material 54 as shown in FIG. 6. The configuration of zones Z on heat transfer material 54 can be configured so that it cooperates with zones Z of electrical elements 48 and 50 to allow more volume for filling over all zones Z.

Figure 10:
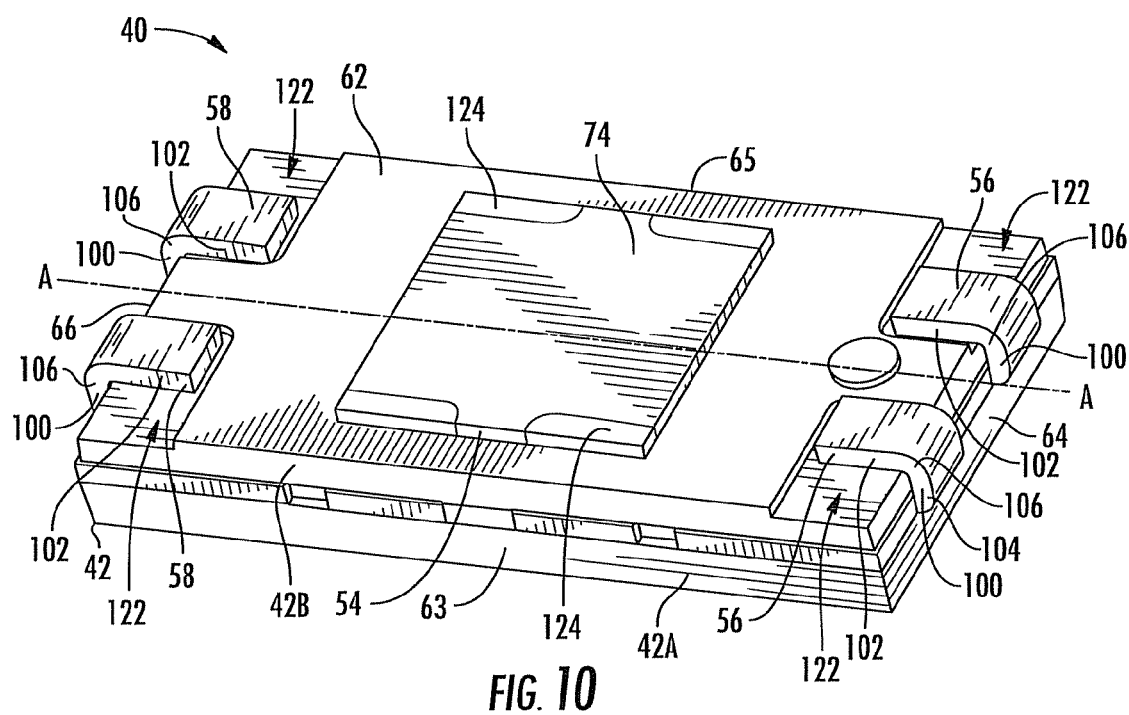
FIG. 10 illustrates a perspective bottom view of an embodiment of an LED package according to the subject matter herein.

Still referring to FIG. 6, each of first and second apertures 84 and 90 can provide multiple benefits. For example, at least a portion of first and second apertures 84 and/or 90 can become at least partially filled with body material. This can promote secure retention of the first and second electrical leads 48 and 50 within the body 42. In addition, each of first and second apertures 84 and 90, respectively, can reduce the amount of lead material (e.g., metal) subject to being bent to form the first and second bends 104 and 106, respectively (See FIG. 8). This can reduce the amount of bending force required to form the first and second bends 104 and 106 as is particularly desirable when the first and second bends are formed after molding, or otherwise positioning, body 42 around electrical leads 48 and 50. Bending is preferably performed sufficiently to position first and second external portions 56 and 58 of first and second electrical leads 46 and 50 at least partially within the recesses 122 of lower surface 62 of body 42 (FIG. 10). First and second apertures 84 and 90 can also serve as the area through which plastic flows during molding.

Figure 7:
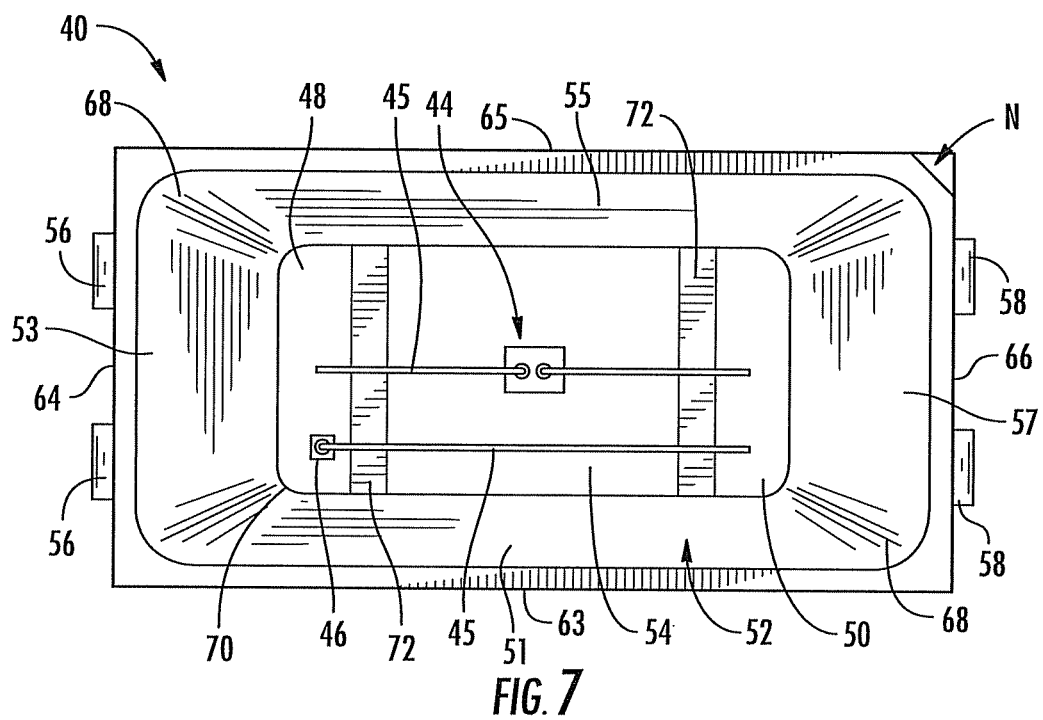
FIG. 7 illustrates a top plan view of an embodiment of an LED package according to the subject matter herein.

FIG. 7 is a top view of LED package 40, and can more clearly illustrate features which have been previously described. FIG. 8 is a side view of LED package 40. As illustrated in FIG. 8, electrical elements can comprise first and second electrical leads 48 and 50 formed from a leadframe which can serve as anode and cathode connections supplying the LED chips 44 with current sufficient for illuminating the chips. In one aspect, electrical leads 48 and 50 can comprise a metal or any other suitable electrically conducting material known in the art. First electrical lead 48 can comprise one or more first external portions 56 extending from body 42. Second electrical lead 50 can comprise one or more second external portions 58 extending from body 42 at opposing lateral sides, for example, second and fourth lateral sides 64 and 66, respectively. Each of the external portions 56 and 58 can comprise mirror images or different configurations. For illustration purposes, external portions 56 and 58 are shown as mirror images. As best illustrated in FIG. 8, external portions 56 and 58 can comprise a vertical portion 100 extending external the lateral sides of body 42. In one aspect, external portions can extend from opposing lateral faces of the body outward from a center portion of the package. Each vertical portion 100 can extend from body 42 at a lateral exterior face and transition into a linear portion 102 which can extend below lower surface 62 of body 42 and turn in towards thermal element 54. When external portions 56 and 58 are disposed on opposing sides, linear portions 100 can turn in toward and face each other. A first bend 104 can be disposed adjacent lateral side walls where external portions 56 and 58 first protrude from LED package 40. Each vertical portion 100 can transition to form linear portion 102 at a second bend 106. Second bends 106 can be disposed below vertical portion 100 and can perpendicularly transition the vertical portion 100 into the linear portion 102. This configuration can be referred to as a "J-bend" type lead component. Linear portion 100 can electrical connect with and external source when soldered or otherwise suitably connected. For illustration purposes, the J-bend lead component is illustrated, however, any suitable configuration of lead components is contemplated herein. External portions 56 and 58 can be soldered or otherwise electrically connected to an electrical current source and external heat sink to permit operation of the one or more LED chips 44.

Still referring to FIG. 8, one or more recesses R can be defined in exterior side walls of the body 42 adjacent to (e.g., below) locations where the external portions of the leads 56 and 58 extend through the exterior side walls. Such recesses R can be disposed in lower portion 42B of the body and can taper inwardly towards the heat transfer material 54 and below the first bends 104 in external portions 56 and 58 of the leads. Each recess R can have a depth relative to the corresponding exterior side wall, for example, lateral walls 64 and 66, with the depth of each recess R preferably being at least as large as an average thickness of the electrical leads. Recesses R can provide multiple benefits. First, the recesses R can eliminate presence of material immediately disposed below first bends 104 thereby reducing stress applied to body 42 when first bends 104 are formed after the leads 80 are retained in body 42. Second, recesses R can enable each first bend 104 to have a tighter bending radius and reduce or eliminate outward extension of the first bend 104 thereby reducing the effective footprint of LED package 40. A smaller footprint can enable LED packages such as package 40 to be mounted at higher densities over an external substrate, for example a panel for a panel display system. LED packages 40 can optionally be overlaid with a Lambertian reflector or diffuser having reduced hole spacing (e.g., within a backlit display device, such as a LCD display), thereby enhancing lighting performance such as by enabling higher flux density and/or greater lighting uniformity.

Figure 18:
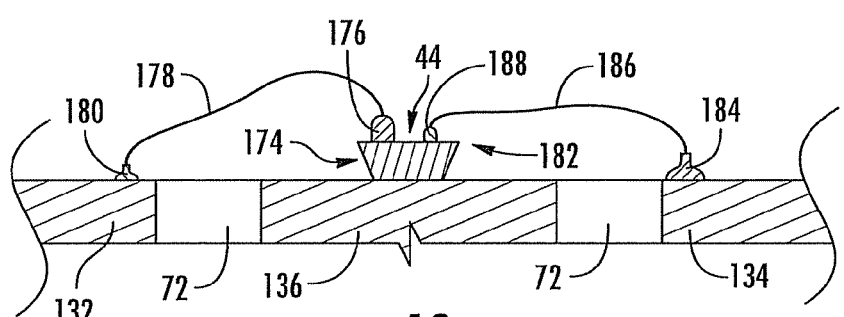
FIG. 18 is a side view of a portion of an LED package showing a mounted LED according to the subject matter herein.

FIG. 8 further illustrates package thickness T as measured from upper surface 60 of LED package body 42 to a lower surface of linear portion 102 of the electrical leads. Package thickness T can comprise any suitable thickness. In one aspect, thickness T can be improved to be a thin package, such as for example and without limitation, substantially equal to or less than 0.9 mm. In one aspect, thickness T can be approximately 0.86 mm or less. Thickness T can be improved by maintaining industry standard brightness levels and heat dissipation by retaining a somewhat thick heat transfer material 54, for example, a 0.5 mm thick heat transfer material and optimizing the cavity space in which one or more LED chips 44 can be disposed. For example, a depth of reflector cavity 52 can be reduced by using smaller chips and/or reverse wirebonding (FIG. 18). The package thickness T dimension can at least partially correspond to the thickness dimension of the reflector cavity 52 and the LED chip 44 thickness disposed therein. In addition, the package thickness T dimension can at least partially correspond to a measurement of heat transfer material 54.

Figure 9A:
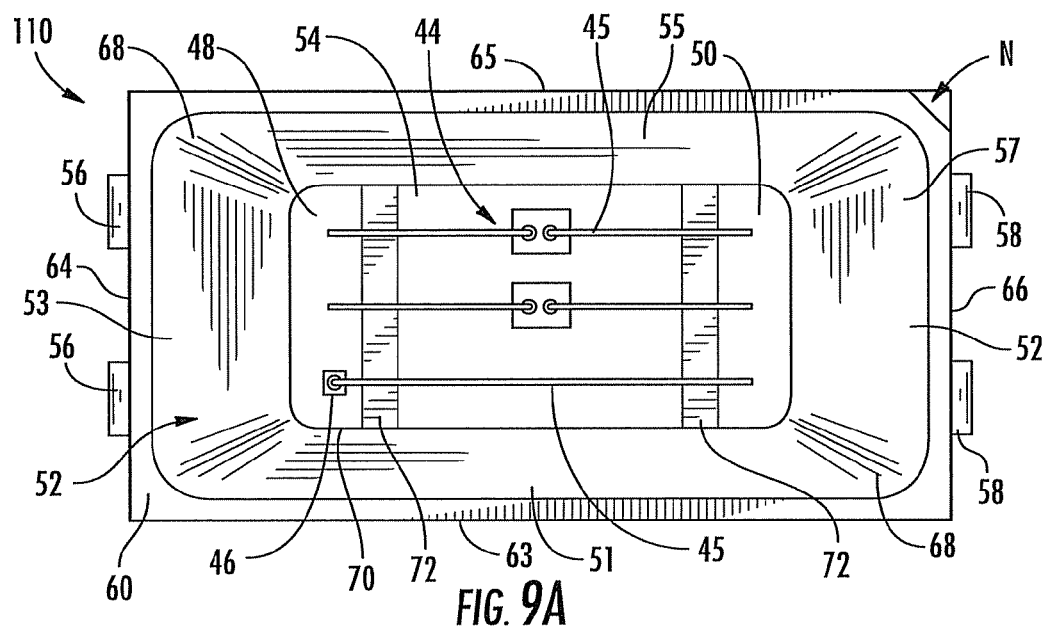
FIGS. 9A and 9B illustrate top plan views of an embodiment of an LED package according to the subject matter herein.
Figure 9B:
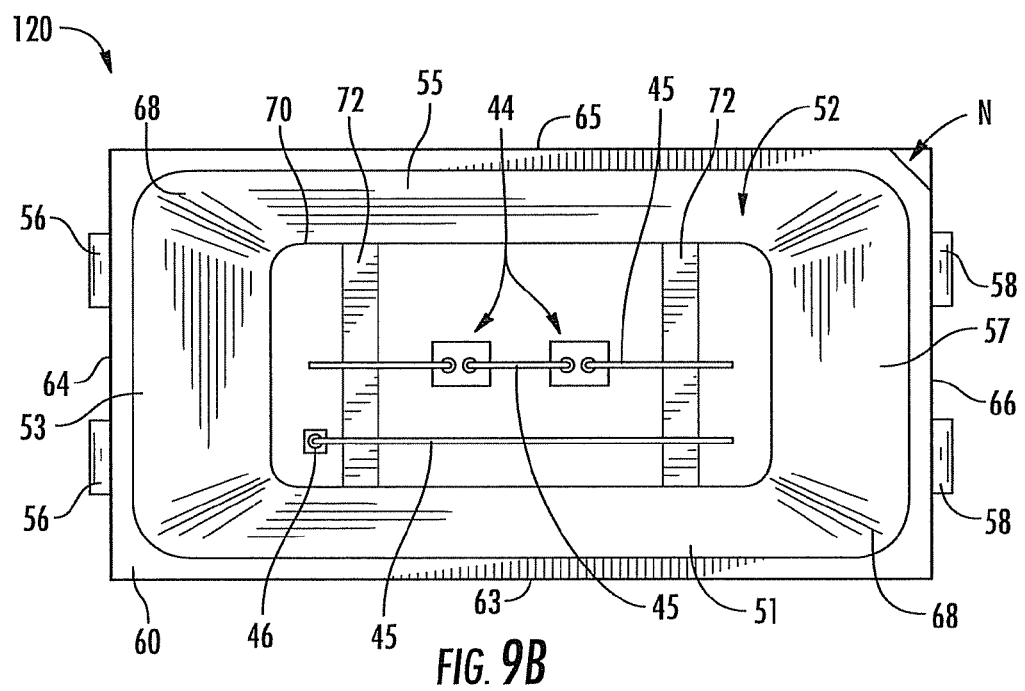

FIGS. 9A and 9B illustrate different embodiments of LED package 40. For example, FIG. 9A illustrates a LED package, generally designated 110 which is similar in form and function to LED package 40. LED package 110, however, can comprise at least two LED chips 44 mounted in parallel over heat transfer material 54. That is, LED package 110 can comprise at least two LED chips 44 electrically connected in parallel. Each of the at least two LED chips 44 can electrically connect through one or more wirebonds 45 to each of the first and second electrical leads 48 and 50, respectively. In one aspect, the at least two LED chips 44 can comprise an array of LED chips 44 connected in parallel.

FIG. 9B illustrates an LED package generally designated 120 comprising at least two LED chips 44 electrically connected in series. LED package 120 can be similar in form and function to LED package 40. LED package 120, however, can comprise at least two LED chips 44 mounted in series over heat transfer material 54. That is, LED package 120 can comprise at least two LED chips 44 wherein a first of the at least two LED chips are electrically connected to first electrical lead 48 and a second of the at least two LED chips 44 is electrically connected to second electrical lead 50. The at least two LED chips 44 can then be electrically connected to each other using electrically conductive wirebonds 45. When connecting LED chips 44 in series, it can be important to electrically connect the electrical terminal of a preceding LED to an opposite electrical terminal of a subsequent LED to ensure electrical current or signal will not be shorted in the series. In one aspect, the at least two LED chips 44 can comprise an array of LED chips connected in series.

Figure 13:
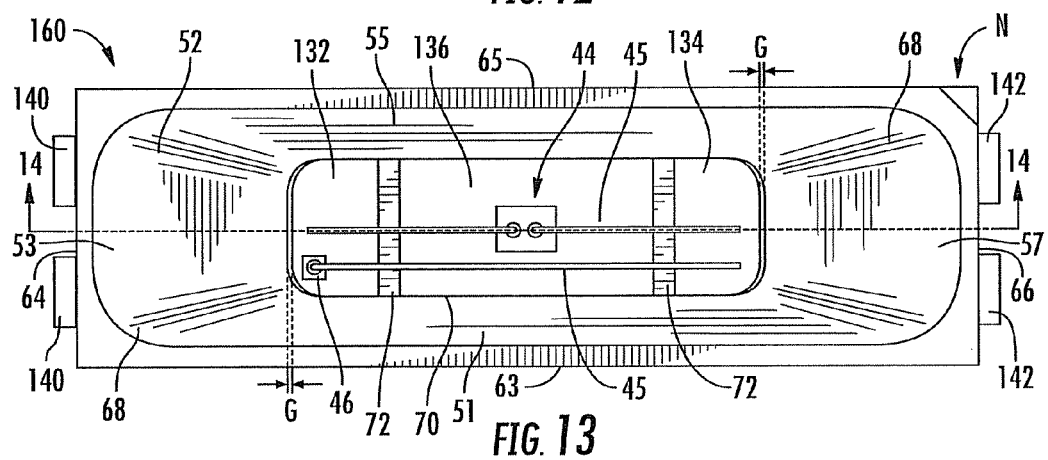
FIG. 13 illustrates a top plan view of an embodiment of an LED package according to the subject matter herein.

FIG. 10 illustrates a bottom view of LED package 40 (and, for example, a bottom view of LED packages 110, 120, and/or 160 of FIG. 13) and exposed lower surface 74 of heat transfer material 54. Lower surface 62 of body 42 can comprise one or more recessed portions generally designated 122 which can be disposed below external portions 56, 58 of electrical leads 48 and 50. Recessed portions 122 provide a location and place for linear portions 102 of the leads so that the bottom surface of external portions 56 and 58 can in one aspect be flush and co-planar with lower surface 74. Recessed portions 122 also can allow overflow of attachment material, for example solder and/or flux, to move into recessed portion 122 when attaching LED package 40 to an external substrate, for example, a substrate used in backlighting and/or panel display systems. In some instances, at least a portion of body 42 can externally mold about at least a portion of heat transfer material 54 in addition to internally molding about heat transfer material 54. For example, FIG. 10 illustrates one or more corner portions 124 of the heat transfer material having body material molded or otherwise disposed over and/or adjacent heat transfer material 54. External portions 56 and 58 of electrical leads 48 and 50, respectively, can be disposed inboard of the outermost corners of LED package 40. For example, external portions 56 and 58 of electrical leads 48 and 50, respectively, can comprise at least two external portions disposed on either side of a central axis A-A of package 40, inboard from the edges of lateral sides 63 and 65, and external portions can extend inwardly towards heat transfer material 54 and towards each other. In one aspect, LED package 40 can comprise at least two external portions 56 and 58 extending per lateral side 64 and/or 66 which can bend such that each external portion is disposed and extended over lower surface 62 of package and can be at least partially disposed in recessed portions 122.

Figure 11:
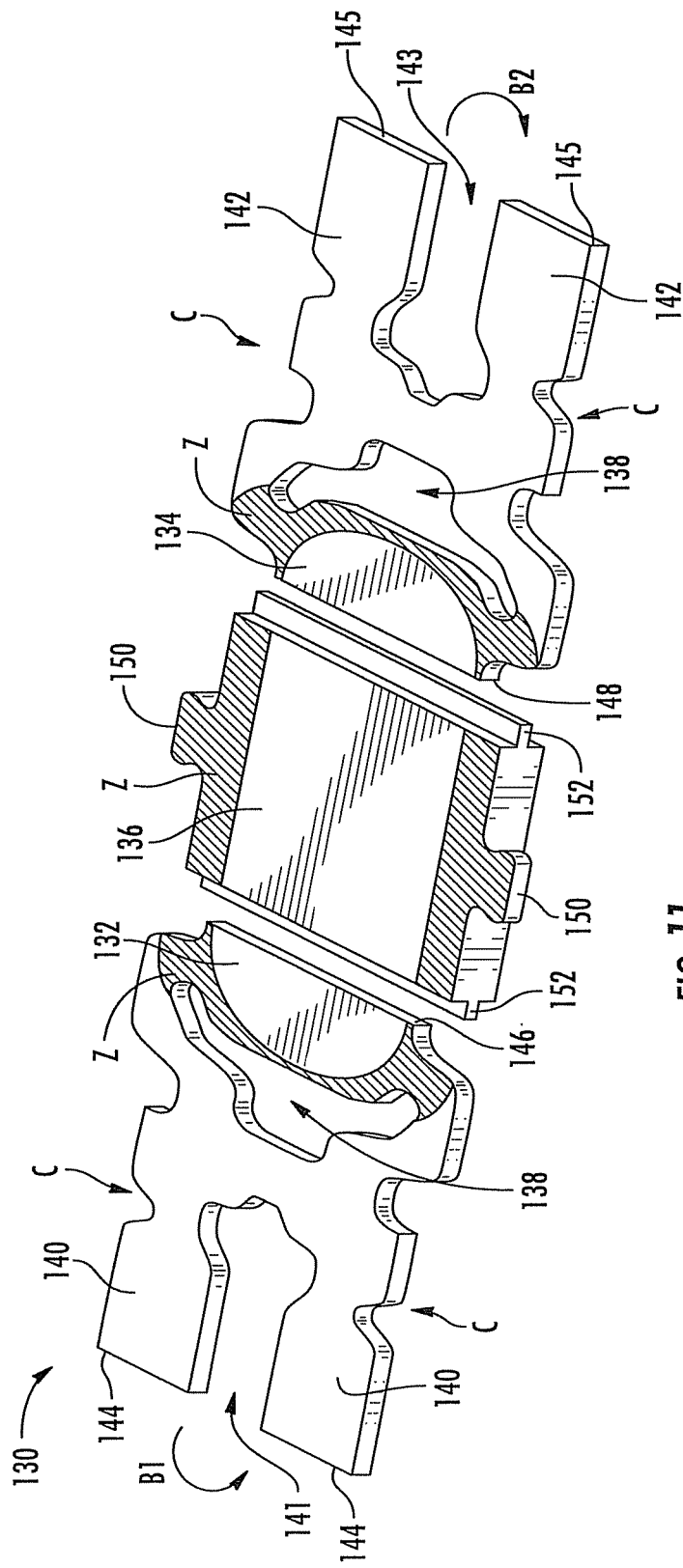
FIG. 11 illustrates a perspective top view of leads that can be used in an LED package according to one aspect of the subject matter herein.

FIG. 11 illustrates a second embodiment of leads, generally designated 130. Leads 130 can be adapted to allow complete resin filling and high adhesion within a given LED package, for example, LED package 160 discussed in FIGS. 12 and 13. Leads 130 can comprise first and second electrical elements, such as first and second electrical leads 132 and 134. First and second electrical leads 132 and 134 can be similar in form and function to first and second electrical leads 48 and 50 previously discussed. For example, first and second electrical leads 132 and 134 can be at least partially disposed within a portion of a body forming an LED package. First and second electrical leads 132 and 134 can electrically communicate to one or more LEDs or LED chips disposed within a given LED package. First and second electrical leads 132 and 134 can comprise an anode and cathode for supplying electrical current to the one or more LED chips, and the electrical leads can comprise any suitable electrically conducting material.

Figure 12:
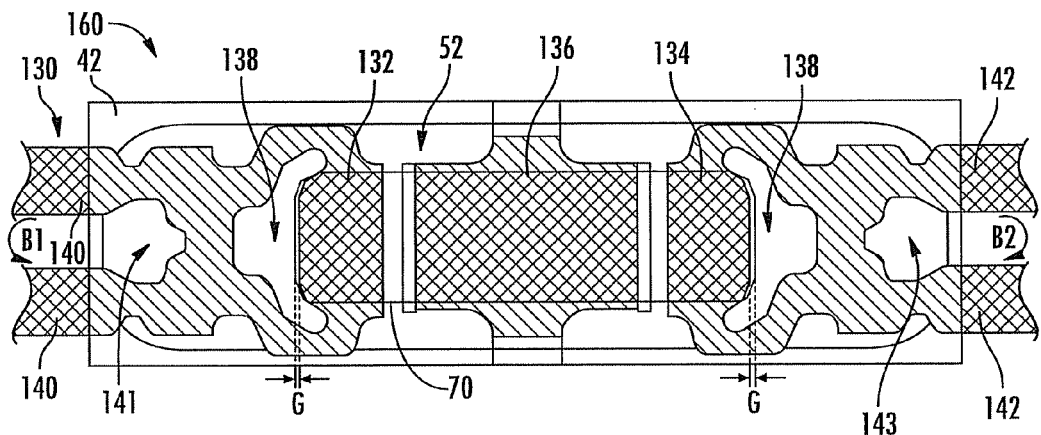
FIG. 12 illustrates a schematic view of a leadframe disposed within an LED package according to the subject matter herein.
Figure 14:
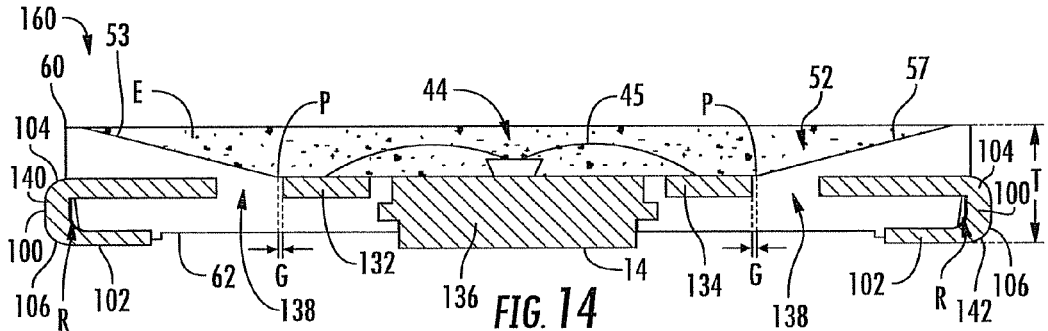
FIG. 14 illustrates a cross-sectional view of one embodiment of a high-brightness LED package with improved resin filling and adhesion according to the subject matter herein.

As FIG. 11 further illustrates, leads 130 can further comprise a thermal element, for example, heat transfer material 136. Thermal element can be similar in form and function to heat transfer material 54 of leads 80 (FIG. 6), previously described. In one aspect, heat transfer material 136 can be disposed between electrical elements, however, any configuration is contemplated. A body can mold about portions of the electrical and thermal element thereby providing a LED package. Notably, leads 130 can comprise one or more openings, generally designated 138 disposed therein. Body material can at least partially mold and fill openings 138 to increase adhesion between package components. In addition, openings 138 can facilitate complete resin filling by providing areas which body material can flow in to inboard of a point P of an LED package (FIGS. 12-14). For example, at least a portion of openings 138 can comprise a portion of cavity floor 70 such that body material can flow around and into openings forming a portion of cavity floor 70 flush with upper surfaces of the electrical elements or leads. Openings 138 can be formed using any suitable process. In one aspect, openings 138 can comprise portions removed from leads 130, for example, by stamping, punching, drilling, etching, and/or combinations thereof.

FIG. 11 illustrates first and second electrical leads 132 and 134 can extend outwardly from a proximal edge and around openings 138. First and second electrical leads 132 and 134 can further extend into one or more respective first and second external portions 140 and 142. For example, first electrical lead 140 can comprise a proximal edge 146 disposed adjacent to heat transfer material 136. First electrical lead 132 can extend about opening 138 and about a first aperture 141 thereby forming at least two external portions 140. First electrical lead can extend about multiple openings 138 and/or apertures 141 thereby forming a plurality of external portions 140. Each of external portions 140 can bend externally in a direction indicated by the arrow B1 into a vertical portion perpendicular a linear portion as described in FIG. 8, for example forming a J-bend configuration bending inwardly towards the lower surface of heat transfer material 136. External portions 140 can comprise distal ends 144 distally located from heat transfer material 136 which can be sheared or otherwise singulated from a sheet of metal comprising a plurality of leads 130.

Similarly, second electrical lead 134 can comprise a proximal edge 148 disposed adjacent to heat transfer material 136. Second electrical lead 134 can extend about opening 138 and about a second aperture 143 thereby forming at least two external portions 142. Second electrical lead could extend about multiple openings 138 and/or apertures 143 thereby forming a plurality of external portions 142. Each of external portions 142 can bend externally in the direction indicated by the arrow B2 into a vertical portion perpendicular a linear portion as described and illustrated by FIG. 8, such as forming a J-bend configuration bending inwardly towards the lower surface of heat transfer material 136. Such bending of external portions 140 and/or 142 can be performed after forming of the body structure. External portion 142 can comprise distal ends 145 distally located from heat transfer material 136. Heat transfer material 136 can comprise one or more terminating ends 150 which can be sheared or otherwise singulated from a sheet of leads 130. Terminating ends 150 of heat transfer material 136 can be sheared substantially flush with lateral walls, for example, walls 63 and 65 of LED package 160 (FIGS. 12-14). Heat transfer material 136 can comprise lateral protrusion 152 to further increase adhesion with the molded material forming the body. Similar to leads 80 shown and described in FIG. 6, leads 130 can comprise curved surfaces, or profiles C which can improve adhesion of the molded body to outer edges of the leadframe components.

As shown for example in FIG. 6, zones Z as shown in FIG. 11 also can be disposed on electrical elements 132 and 134 and can also be disposed on heat transfer material 136. For example, heat transfer material 136 can comprise zones Z that can be disposed on opposing portions of the same surface of heat transfer material 136. The configuration of zones Z on heat transfer material 136 can be configured so that it cooperates with zones Z of electrical elements 132 and 134 to allow more volume for filling over all zones Z.

FIG. 12 illustrates what leadframe looks like when molded within an LED package, generally designated 160. LED package 160 can be similar in form and function to that of packages 40, 110, and 120 previously described with exception of the leadframe. LED package 160 can comprise a body 42 which molds about a portion of leads 130. At least a portion of leads 130 can be internally molded within body 42. At least a portion of electrical leads 132 and 134 and heat transfer material 136 can be external body 42 and disposed in the bottom of the cavity floor 70. For example, the areas of FIG. 12 having one shaded line can comprise areas of leads 130 which are disposed within body 42 of LED package 160. Areas of two shaded lines (cross-hatched areas) indicate portions of the leads 130 which can be external of body 42. The cross-hatched areas bounded by cavity floor 70 include areas which are disposed within reflector cavity 52. External portions 140 and 142 can be sheared at their distal ends and bent in the directions indicated by arrows B1 and B2 underneath the body. Side and bottom views of LED package 160 can be the same as that of FIGS. 8 and 10 previously described.

Referring to FIG. 13, one or more LED chips can directly and/or indirectly mount over heat transfer material 136 and can electrically connect to electrical leads 132 and 134 using wirebonds 45. At least a portion of plastic or resin body material can mold into openings 138 (FIG. 12) thereby facilitating a portion of the body formed inboard the perimeter of cavity floor 70. When body material molds into opening 138, electrical elements can become spaced apart from the bounded edge of the cavity floor 70. That is, first and second electrical elements 132 and 134 can comprise an edge displaced at least a distance, or gap G, from an intersection area proximate the edge of cavity floor 70. With the exception of at least this feature, LED package 160 can be similar to previously described LED package 40. In one aspect and without limitation, gap G can be less than approximately 100 μm, but gap G can also be more than approximately 100 μm. In one aspect, gap G can be from approximately zero (0) to 100 μm, although the metal electrical elements 132 and/or 134 can go and be disposed under the plastic also, in which case gap G would be non-existent (less than zero (0) μm).

FIG. 14 illustrates a cross-sectional view of LED package 160. Here it can be seen that when the body molds into openings 138, first and second electrical elements 132 and 134 become displaced a distance from point P at which the cavity floor 70 intersects cavity walls 53 and 57 of reflector cavity 52. In one aspect, first and second electrical elements 132 and 134 are displaced a distance of gap G inboard point P. Thus, the area below point P can be completely filled with material during the molding process, and can eliminate voids or area of plastic non-filling. Adhesion of components within LED package 160 can be improved, and brightness can be maintained as the cavity 52 comprises a maximum surface area extending from an upper surface 60 of LED package 160 to cavity floor. Thickness T of package 160 can comprise approximately 0.90 mm or less. In one aspect, thickness T can comprise approximately 0.86 mm or less. In one aspect, point P comprises an intersection area formed by one or more cavity walls 53, 57 extending toward and intersecting cavity floor 70.

Figure 15:
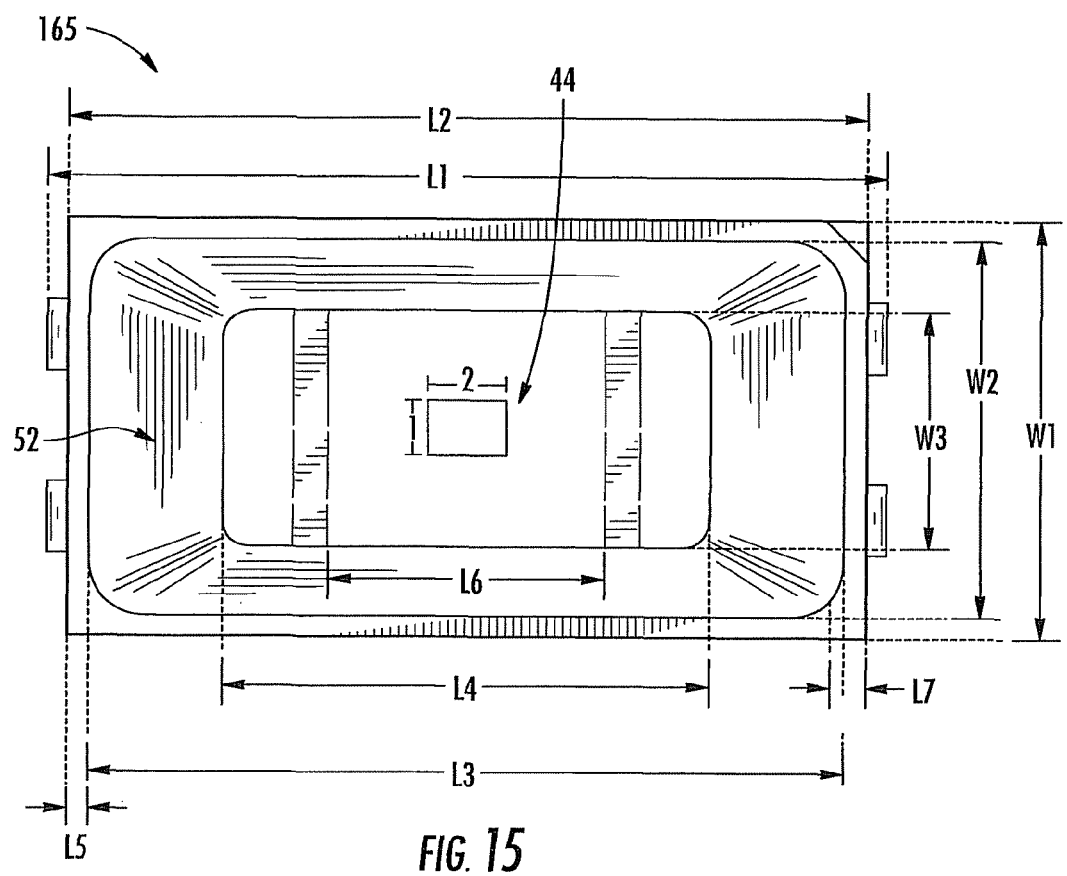
FIG. 15 illustrates a top plan view of an embodiment of an LED package according to the subject matter herein.

FIG. 15 illustrates a top view of an LED package generally designated 165. LED package 165 is shown with one LED chip 44 schematically illustrated therein, but there can also be one or more multiple LED chips 144. LED package 165 is generic and included herein to illustrate various dimensions. Thus, LED package 165 can comprise any of packages 40, 110, 120, and/or 160 previously described. LED chip 44 can comprise a width 1 and a length 2 which can be any suitable dimensions such as according to the measurement data in Table 2 discussed further below. LED package 165 illustrates various dimensions of the package itself. For example, dimensions that can exist in one aspect, for example, lengths, widths, thicknesses, and areas, can be such as those illustrated in FIG. 15 and disclosed in Table 1 below. This is just one example of configuration ranges for the identified features, and other packages of other dimensions can also exist and can, for example, be several times larger or smaller even.

TABLE 1

| Reference Character | Description of Dimension | Approx. Measurement Ranges (in mm) |
|---|---|---|
| L1 | Overall package length, including portions of electrical leads | 6 to 7 |
| L2 | Length of package body | 5.7 |
| L3 | Length of reflector cavity measured at upper surface of body | 5.4 |
| L4 | Length of cavity floor | 3.47 |
| L5 | Length of upper surface of body disposed outside of reflector cavity | 0.15 |
| L6 | Length of upper surface of heat transfer material | 1.97 |
| L7 | Corner length | 0.3 |
| W1 | Width of overall package body | 2 to 3 |
| W2 | Width of reflector cavity measured at upper surface of body | 2.7 |
| W3 | Width of cavity floor | 1.7 |
| *T | Overall thickness of package | 0.86 |

*designates the thickness dimension as illustrated in FIGS. 8 and 14

Table 1 above illustrates possible length and width dimensions for LED package 165. In one aspect, the overall package area (L1×W1) can be approximately 18 mm² when calculated from a 6 mm×3 mm package. In another aspect, overall package width can be 14 mm² when calculated from an approximately 7 mm×2 mm package. Any shape, dimension, and structure of LED chip such as LED chip 44 can be used in LED package 165. As described earlier, more than one LED chip 44 can be disposed in LED package 165. LED chip 44 can have various lengths and widths and are not limited to those as shown in Table 2, which are approximately (i) 300 μm×300 μm, (ii) 500 μm×500 μm, (iii) 520 μm×700 μm, and (iv) 430 μm×580 μm. Any suitable dimension of LED chip 44 can be used. Where thicker LED chips 44 are used, the thickness of overall package T can increase slightly above 0.90 mm. For example, package thickness can comprise approximately 0.97 mm, 1.08 mm, or any suitable thickness depending on the thickness of the LED chips disposed in package.

LED package 165 can be provided in various lengths, widths, and in thicknesses with smaller LEDs, such as LED chip 44, than LED chips in conventional packages. For example and without limitation, Table 2 illustrates various sizes (area) and ratios of dimensions for LED package 165 (and therefore packages 40, 110, 120, and 160).

TABLE 2

| Package Area | Approx. Area of Package Feature (L × W (mm)) | Approx. Area of LED chip (L × W (μm)) | Ratio of LED chip to Package Feature | % of Package Feature Occupied by LED chip |
|---|---|---|---|---|
| Package Area (L1 × W1 in FIG. 15) | 6 × 3 | 520 × 700 (=364,000) | 0.020 | 2.02 |
| | 6 × 3 | 500 × 500 (=250,000) | 0.014 | 1.39 |
| | 6 × 3 | 430 × 580 (=249,500) | 0.014 | 1.39 |
| | 6 × 3 | 300 × 300 (=90,000) | 0.005 | 0.50 |
| | 7 × 2 | 520 × 700 | 0.026 | 2.60 |
| | 7 × 2 | 500 × 500 | 0.018 | 1.79 |
| | 7 × 2 | 430 × 580 | 0.018 | 1.78 |
| | 7 × 2 | 300 × 300 | 0.006 | 0.64 |
| Cavity floor Area (L4 × W3 in FIG. 15) | 3.47 × 1.7 | 520 × 700 | 0.062 | 6.17 |
| | 3.47 × 1.7 | 500 × 500 | 0.042 | 4.24 |
| | 3.47 × 1.7 | 430 × 580 | 0.042 | 4.23 |
| | 3.47 × 1.7 | 300 × 300 | 0.015 | 1.53 |

Table 2 above illustrates for example and without limitation possible LED chip 44 to package ratios for different package areas. LED chip 44 can be a range between approximately 0.5 and 2% of the overall package area in an approximately 6×3 mm package where at least one LED is disposed within the package. Ratio and percentage calculations in Table 2 are based on total chip area. That is, in Table 2, the column indicating an approximate area of the LED is the length and width for one LED chip. If two or more LED chips 44 are used in a package, the ratios could change. In one aspect. LED chip 44 can range less than approximately 5% of the overall package area. In other aspects, LED chip 44 can range less than approximately 3% of the overall package area. In other aspects. LED chip 44 can range less than approximately 2% of the overall package area. In other aspects. LED chip 44 can range less than 1% of the overall package area. In conventional packages similar in area to a 6×3 mm package, the LED such as LED chip 44 can typically average greater than approximately 2% of the overall package area.

An LED such as LED chip 44 in accordance with the subject matter herein can range between approximately 0.64% and 2.6% of the overall package area in an approximately 7×2 mm package where at least one LED chip 44 is disposed within the package. In one aspect, LED chip 44 can range less than approximately 5% of the overall package area. In other aspects. LED chip 44 can range less than approximately 3% of the overall package area. In other aspects, LED chip 44 can range less than approximately 2% of the overall package area. In other aspects, LED chip 44 can range less than 1% of the overall package area.

Similarly, for a rectangular cavity floor of approximately 3.47×1.7 mm, one LED chip 44 can range from between 1.53% to 6.17% of the area comprising the cavity floor. That is, in one aspect, LED chip 44 can be less than approximately 7% of the cavity floor. In a further aspect, LED chip 44 can be less than or equal to approximately 6.5% of the cavity floor. In other aspects. LED chip 44 can be less than approximately 5% of the cavity floor. In other aspects. LED chip 44 can be less than approximately 3% of the cavity floor. In other aspects. LED chip 44 can be less than approximately 2% of the cavity floor. In other aspects. LED chip 44 can be less than approximately 1% of the cavity floor. In other aspects, LED chip 44 can be less than approximately 0.5% of the cavity floor.

Figure 16:
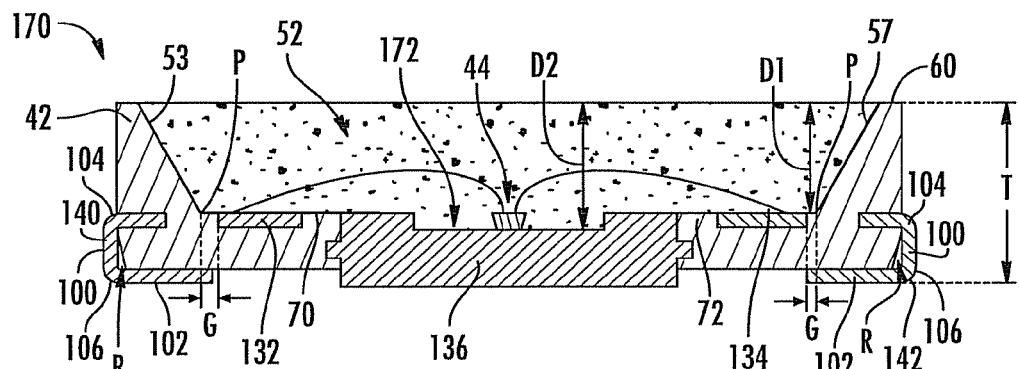
FIG. 16 illustrates a cross-sectional view of an embodiment of an LED package according to the subject matter herein.

FIG. 16 illustrates another embodiment of a cross-sectional view of an LED package generally designated 170. FIG. 16 is similar in form and function as that shown in FIG. 14, however, as illustrated thermal element may comprise a recessed surface disposed in atop surface of the heat transfer material, otherwise known as a down-set surface. Heat transfer element 54 of LED package 40 can also comprise a recessed surface, but for illustration purposes, only on package is illustrated. FIG. 16 illustrates body 42 defining reflector cavity 52. Reflector cavity 52 can comprise cavity floor 70 that can, in one aspect, can be flush with an upper surface of first and second electrical leads 132 and 134, respectively. Cavity floor 70 can be disposed between points P where the cavity floor intersects one or more cavity walls 53 and 57 of reflector cavity 52. An upper surface of heat transfer material 136 can comprise a recess portion 172 that can be down-set from cavity floor 70 and point P. As with FIGS. 4-5b, point P can comprise an intersection area where the cavity walls extend toward and intersect with the cavity floor. In one aspect, reflector cavity 52 can comprise a depth D1 disposed between cavity floor 70 and upper surface 60 of body 42. In one aspect for example, depth D1 can comprise approximately 0.4 mm or less. In one aspect, depth D1 can comprise approximately 0.36 mm or less. Depth of reflector cavity 52 can be less than a depth D2 from the upper surface 60 of body 42 and the recess portion 172 of heat transfer material 136. In one aspect, thickness of package from upper surface 60 of body 42 to the bottom of exterior portions of electrical leads 140 or 142 can be approximately equal to or less than 0.86 mm, and the thickness of the heat transfer material 136 which is not recessed can be 0.5 mm. Reflector cavity 52 of LED package 170 can be approximately 42% of the overall thickness T. LED packages 40, 110, 120, 160, and 165 can also comprise a cavity depth of 0.36 mm and the same overall package thickness ratio. Conventional LED packages can be thicker and have cavity depths averaging greater than 0.4 mm. Thus, conventional packages disadvantageously have a very different ratio of cavity to overall thickness and have not been improved to be as thin as possible while maintaining or exceeding brightness levels and thermal management properties.

Figure 17A:
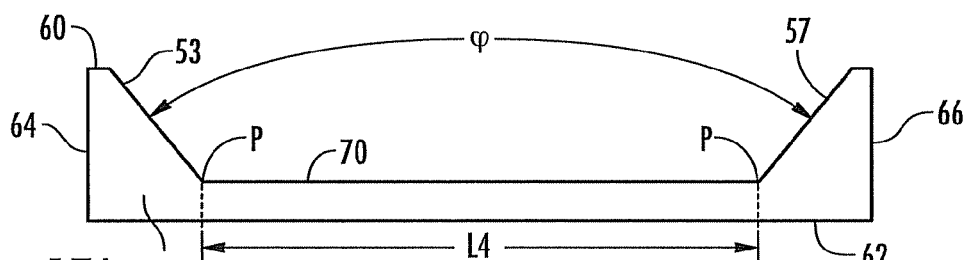
FIGS. 17A and 17B illustrate side views of an embodiment of an LED package according to the subject matter herein.
Figure 17B:
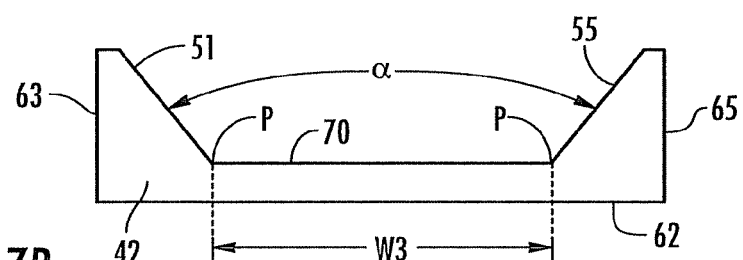

FIGS. 17A and 17B illustrate schematic drawings of cavity angles of which LED packages, such as LED package 40, 160 and other packages described herein can have. In one aspect, a cavity angle can comprise a cavity angle measured between walls of reflector cavity 52. In one aspect, cavity angles of packages described herein can comprise 140° or less. For example, FIG. 17A illustrates a portion of cavity floor 70 disposed between exterior lateral walls 64 and 66. That is, FIG. 17A illustrates the longer measurement L4 of cavity floor. In one aspect for example, the cavity angle φ between the cavity walls 53 and 57 of the reflector cavity 52 can be approximately 139.1° where the thickness T of the overall package (FIGS. 8, 14) can be approximately 0.86 mm. In one aspect, cavity angle φ between the cavity walls 53 and 57 of the reflector cavity 52 can be at least approximately 135° or more.

Where thicker LED chips are used, the overall thickness of the package can increase to approximately 0.97 or 1.08 mm. Thus, in one aspect, the cavity angle φ between the cavity walls 53 and 57 of the reflector cavity 52 can be at least approximately 129° or less, such as for example 128.1°, where the thickness T of the overall package is 0.97 mm. In one aspect, the cavity angle φ between the walls of the reflector cavity 52 can be at least approximately 118° or less where the thickness T of the overall package is, for example, 1.08 mm. Thinner, improved packages with thinner dimensions can comprise larger cavity angles which can allow the reflection level within the package to maintain or exceed the amount of reflected light thereby maintain or exceed current brightness standards. As cavity angles increase, the area beneath the point formed by the cavity wall and cavity floor can become an small that viscous material cannot mold therein, forming voids. The packages described herein can reduce and/or eliminate the voids by providing larger areas below the point where the cavity wall meets the cavity floor, and/or displacing electrical leads at least a distance away from the point, or edge of the cavity floor.

FIG. 17B illustrates a portion of cavity floor 70 disposed between exterior lateral walls 63 and 65. That is, FIG. 17B illustrates the shorter width measurement W3 of cavity floor 70. In one aspect, the cavity angle α between the cavity walls 51 and 55 of the reflector cavity 52 can be 108.5° where the thickness T of the overall package (FIGS. 8, 14) is approximately 0.86 mm. Where thicker LED chips are used, the overall thickness of the package can increase to approximately 0.97 mm or 1.08 mm. Thus, in one aspect, the cavity angle α between the cavity walls 51 and 55 of the reflector cavity 52 can be 93.5° where the thickness T of the overall package is 0.97 mm. In one aspect, the cavity angle α between the cavity walls 51 and 55 of the reflector cavity 52 can be 81.5° where the thickness T of the overall package is 1.08 mm.

FIG. 18 illustrates a wirebonding method which LED packages, systems, and methods disclosed herein can advantageously incorporate. The wirebonding method can comprise a reverse ball-bonding technique. FIG. 18 illustrates LED chip 44 mounted over heat transfer material 136. As previously discussed, LED chip 44 can be directly attached to heat transfer material 136 or indirectly. That is, LED chip 44 can be attached to an intervening submount or substrate disposed between LED chip 44 and heat transfer material 136. LED chip 44 can wirebond to each of electrical leads 132 and 134 for allowing electrical signal to pass between the electrical leads thereby illuminating LED chip 44. Heat transfer material 136 can be electrically and/or thermally isolated from electrical leads by isolating portions 72 of the body disposed therebetween. A conventional wirebonding method is illustrated on the left hand portion of LED chip 44, generally designated 174. The conventional wirebonding method can begin by forming a ball 176 over a bondpad of LED chip 44. A wire 178 extending from the ball connects ball 176 and stitches the wire to the first electrical element 132 forming a stitch 186. As can be noted, the height of stitch 180 is less than the height of ball 176.

A second wirebonding method is illustrated on the right hand portion of LED chip 44, generally designated 182. This method is termed reverse wirebonding which can be advantageous to use in thinner LED packages as the loop and ball height over the LED chip 44 can be reduced. Thus, cavity depth and package thicknesses can be reduced. In reverse wirebonding, a ball 184 can be formed on the electrical element 134 first. A wire 186 can extend from ball 184 and form a stitch 188 on a bondpad of LED chip 44. Notably, the loop and ball heights formed on an upper surface of LED chip 44 on the right hand portion 182 are lower than that of the left hand portion 174. This can be advantageous as smaller cavity depths can be used which can allow for thinner LED packages.

Figure 19A:
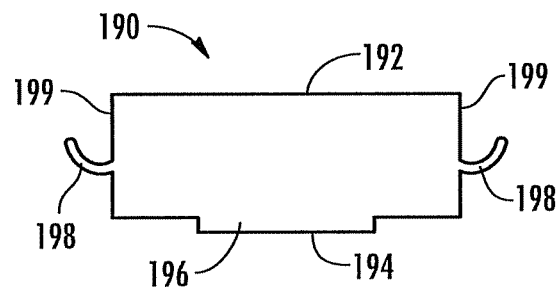
FIGS. 19A and 19B illustrate side views of embodiments of thermal elements of LED package according to the subject matter herein.
Figure 19B:
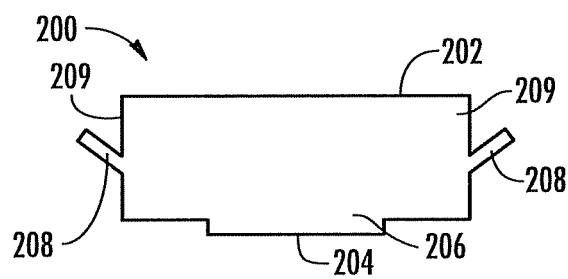
Figure 20:
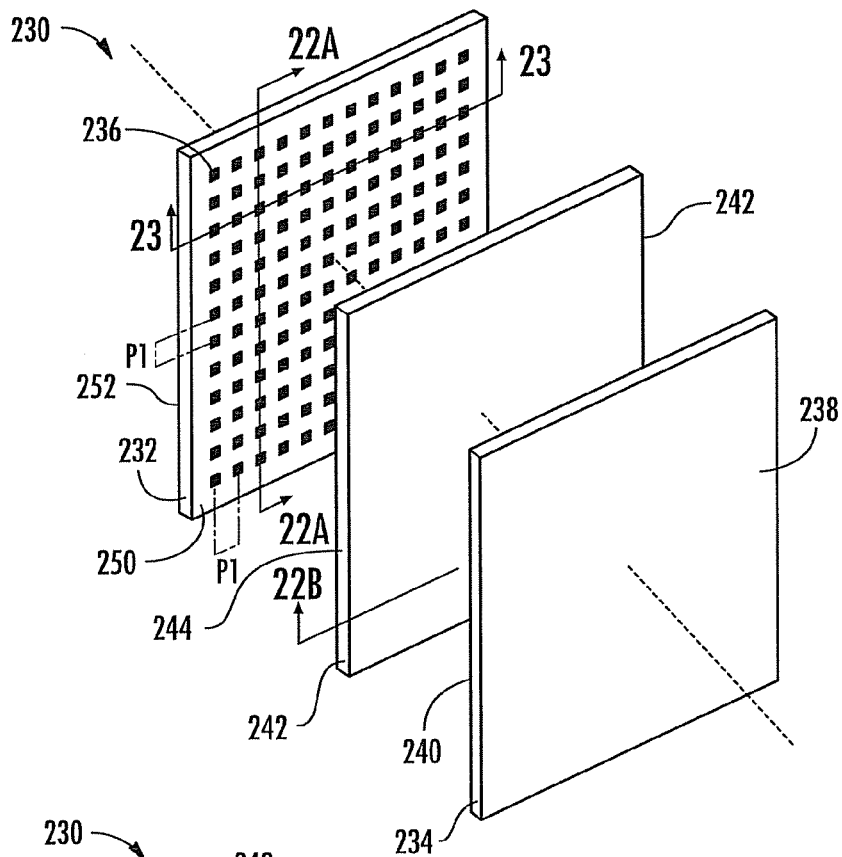
FIG. 20 illustrates a LED backlighting system according to the subject matter herein.

FIGS. 19A and 19B illustrate cross-sectional views of additional embodiments of heat transfer materials for LED packages described herein. As FIGS. 19A and 19B illustrate, lateral protrusions along the exterior edge of heat transfer material can comprise various configurations. For illustration purposes, only two additional embodiments of lateral protrusions are shown, however, any suitable configuration is contemplated. FIG. 19A illustrates a first additional embodiment of heat transfer material, generally designated 190. In this embodiment, heat transfer material 190 can comprise an upper surface 192, a lower surface 194, a lower protruding portion 196, and curved lateral protrusions 198. Curved lateral protrusions 198 can extend outward from lateral side walls 199 of heat transfer material 190. Lower protrusion 196 can be formed integrally with heat transfer material 190 or it can comprise a separate portion affixed thereto using any suitable method. In one aspect, lower protrusion 196 can be advantageous to facilitate better wetting if solder is used to attach LED packages to external substrates. Better wetting can allow for less voids in the solder interface, and can result in a more reliable package. The heat transfer materials illustrated in FIGS. 19A and 19B can be used in any of the LED packages having improved resin filling and high adhesion described here.

Referring to FIG. 19B, in another embodiment heat transfer material, generally designated 200 is illustrated. Heat transfer material 200 can comprise an upper surface 202, a lower surface 204, a lower protruding portion 206, and upwardly-angled lateral protrusions 208 extending outward and upward from lateral side walls 209. Downwardly-angled lateral protrusions can be employed in a similar embodiment (not shown). Any suitable configuration of the foregoing lateral protrusions may be employed. Lateral protrusions can be formed by any suitable manufacturing method, including but not limited to, stamping, extruding, milling, machining, or any other suitable process. In further embodiments, lateral protrusions can be replaced with, or supplemented by, recesses (not shown) in lateral side walls of heat transfer material for providing similar sealing utility, with such recesses being formable by similar methods.

LED packages, systems, and methods disclosed herein can have longer L70 lifetime values than conventional packages by combining features such as, but not limited to, using improved plastic and/or metal-to-metal die attach methods and materials. For example, metal-to-metal die attach can comprise, for example, one of a flux-assisted eutectic, a metal-assisted non-eutectic, or a thermal compression method which causes a metal contact area of LED chips to directly attach to metal of a mounting substrate. For example, metal contact areas of LED chips can be attached such that the metal directly bonds to metal of a mounting substrate, for example, heat transfer materials as described herein. It is believed that LED packages in accordance with the subject matter herein will be one of the first LED packages for backlighting to be ENERGY STAR® compliant and therefore meet the standards for energy efficiency set by the US Environmental Protection Agency (EPA). ENERGY STAR® products are those meeting the energy efficiency requirements set forth in ENERGY STAR® product specifications, the entire contents of which are hereby incorporated by reference herein.

FIG. 20 illustrates an expanded perspective view of a representative flat display panel system generally designated 230 in which LED packages described herein can be utilized. Embodiments described and illustrated herein can provide uniform backlighting for small or large area display panels greater or less than a dimension of 17" diagonal. Display panel system 230 can be combined with other electrical and/or mechanical elements to provide computer monitors, televisions, and/or other flat display panels. As used herein, "uniform" backlighting means than an ordinary viewer who views the display at a conventional viewing distance is not aware of any discrepancy or variation in backlighting intensity. In some embodiments, variations of less than about 25% can provide uniform intensity, whereas, in other embodiments variations of less than 5% can provide uniform intensity. Display panel system 230 can comprise square, rectangle, or any suitable shaped panels of any suitable dimension. Embodiments of display panels described herein can provide direct backlighting of flat panel LCDs.

FIG. 20 illustrates display panel system 230 comprising an illumination panel 232 and a display panel, or LCD panel 234. Illumination panel 232 can comprise a plurality of LED packages or LED chips 236. In one aspect, illumination panel 232 can comprise a planar (i.e., two dimensional) array of LED chips 236 mounted either directly over illumination panel 232 or arranged in packages over illumination panel 232. LED chips 236 can be spaced apart from one another at a predetermined distance, or pitch P1 on as to provide substantially uniform backlighting of LCD panel 234. LED chips 236 can be packed in a random array, a grid array (as shown), a staggered array, or any suitable array. Uniform and/or non-uniform packing may be provided. Pitch P1 between adjacent LED chips 236 can allow for uniform backlighting of at least a portion of LCD panel 234. In one aspect. LED chips 236 can provide uniform backlighting over the entire LCD panel 234. A frame (not shown) can be disposed about illumination panel 232 and LCD panel 234 to hold the panels adjacent and either together or spaced apart with one or more gaps disposed therebetween.

LCD panel 234 can comprise a flat display panel having planar array of LCD devices, or cells. In one aspect. LCD panel 234 can comprise a planar array of liquid crystal devices arranged into a matrix of pixels (not shown). An image can form on a front display surface 238 of LCD panel 234 when the liquid crystal devices are subjected to backlight illumination. To provide backlight illumination to LCD panel 234, the planar array of LED chips 236 disposed over illumination panel 232 can be arranged into a matrix such that each LED 236 is arranged to provide illumination to a single LCD device or to a plurality of LCD devices thereby collectively defining specific images on display surface 238. Backlight LED chips 236 can be arranged to illuminate the entirety or a portion of LCD panel 234, the illumination passing through LCD panel 234 from a back surface 240 of the panel through the LCD pixels to the front surface 238 of the display panel. LCD panel 234 can comprise the back surface 240 parallel and opposing front surface 238 and a thickness disposed therebetween defined by the LCD devices, or cells. The thickness of LCD panel 234 can be any suitable dimension.

Optionally, one or more optical layers 242 may be disposed between illumination panel 232 and LCD panel 234. Optical layer 212 can comprise at least one layer or film such as polarizing films, light scattering films, light guide films or any suitable film capable of manipulating light emitted by illumination panel 232. In one aspect, optical layer 242 can comprise a diffuser that distributes light uniformly behind the viewing area. In one aspect, optical efficiency may be enhanced by direct backlighting such that the need for diffusing and/or optical films between illumination panel 232 and LCD panel 234 may be reduced or eliminated. In one aspect, optical layer can comprise an edge 244 along which one or more LED chips 236 may direct light. Optionally, the light could be directed along an edge of LCD panel as described in FIG. 21B.

Figures 21A, 21B:
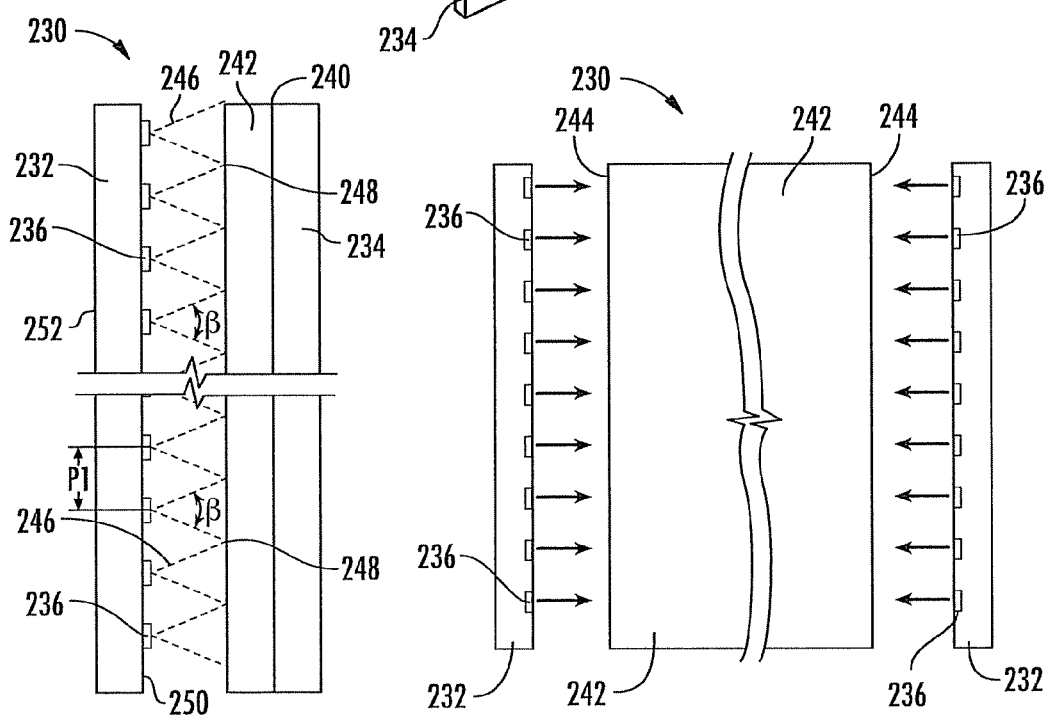
FIGS. 21A and 21B illustrate side views of a LED backlighting system according to the subject matter herein.
Figure 22:
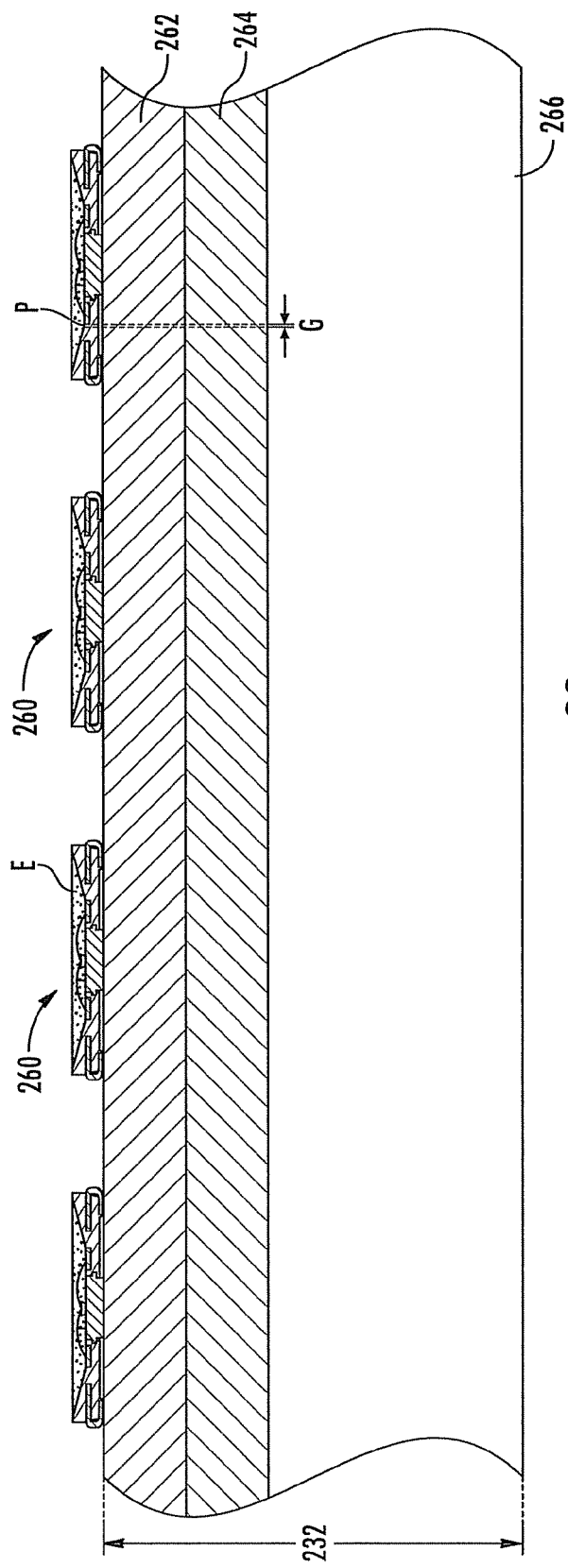
FIG. 22 illustrates a side view of an illumination panel used in an LED backlighting system according to the subject matter herein.

FIGS. 21A and 21B illustrate different cross-sectional views of an unexpanded display panel 230 described and illustrated by FIG. 20. For illustration purposes, the figures illustrate LED chips 236 directing light toward optical layer 242, however, the LED chips 236 in each of FIGS. 21A and 21B could direct light toward LCD panel 234 instead. That is, in FIG. 21A optical layer 242 could be excluded, and in FIG. 21B, optical layer 242 could be replaced with LCD panel 234. The figures could otherwise be the same.

FIG. 21A illustrates one or more LED chips 236 mounted over illumination panel 232 providing direct backlighting to LCD panel 234. LED chips 236 can be disposed adjacent each other spaced apart a pitch P1 in rows, columns, and/or a random or planar array (FIG. 20). Pitch P1 can be the same dimension for LED chips 236 spaced apart between the rows and columns of the planar array, or the LED chips can be spaced apart in rows at a first pitch and spaced apart in columns at a second pitch. Alternatively, any suitable pitch P1 and variations of pitch can be used between the planar array of LED chips 236. FIG. 21A illustrates at least one optical film or layer 242 disposed between illumination panel 232 and LCD panel 234, however, such film is optional. LED chips 236 can provide backlighting directly to LCD panel 234. In one aspect, the planar array of LED chips 236 can be configured to transmit light directly to the planar array of LCD pixels comprising LCD panel 234 over a space, or gap. Light paths 246 can extend across the gap which can be disposed between illumination panel 232 and LCD panel 234, or optical layer 242. Light paths 246 can extend from the one or more LED devices 236. In one aspect, light paths 246 can extend perpendicular to the planar array of LED chips 236 and perpendicular to LCD panel 234. In other aspects, lights paths 246 can extend from an edge parallel optical layer 242 to be guided and diffused uniformly into the back surface of LCD panel 234 (FIG. 21B). That is, in some aspects, at least some of the LED chips 236 can be disposed within a periphery of LCD panel 234.

Still referring to FIG. 21A and in one aspect, each LED chip 236 comprising the planar array of LED chips can emit light at an illumination angle β that can conform to desired radiation patterns. The edges of adjacent light paths 246 can just meet at a periphery 248, or slightly overlap depending on pitch P1 at which adjacent LED chips 236 are spaced. When one or more LED chips 236 are spaced at pitch P1 shown, adjacent light paths 246 can intersect, or touch, at periphery edges 248. If spaced closer together, individual light paths 246 can overlap. Different grids or arrangements of planar arrays of LED chips 236 can also affect the overlap and distribution of light paths 246. In one aspect, light paths 246 can intersect at periphery edges 248 and/or overlap to provide uniform backlighting illumination to LCD panel 234. FIG. 21A illustrates at least one column of the planar array of LED chips 236. Light paths 246 from respective LED chips 236 in adjacent columns and/or rows can intersect and/or overlap. LED chips 236 can also be configured for indirect backlighting of LCD panel 234, for example, LED chips 236 can be disposed around edges of illumination panel and indirectly reflect and illuminate LCD panel 234.

FIG. 21A further illustrates illumination panel 232 comprising a first surface 250 over which the one or more LED chips 236 can mount. Illumination panel 232 can comprise a second surface 252 parallel and opposing first surface 250. First surface 250 of illumination panel 232 can face optical layer 242. In one aspect, first surface 250 of illumination panel 232 can face back surface 240 of LCD panel 234. Illumination panel 232 can comprise any suitable substrate over or onto which LED chips 236 may be mounted. For example, LCD panel 232 can comprise a circuit, PCB. MCPCB, or any other suitable substrate. First surface 250 of illumination panel 232 can comprise an electrically and/or thermally conductive surface. In one aspect, first surface 250 can comprise a metallic surface over which the one or more LED chips 236 can mount. In another aspect, first surface 250 can comprise a planar array of metallic surfaces over which the planar array of LED chips 236 can mount. One or more conductive traces (not shown) can connect the planar array of metallic surfaces such that electrical current or signal can flow to each of LED chips 236.

FIG. 21B illustrates another embodiment of panel display system 230. In this system, the arrows indicate light being directed from the one or more LED chips 236 toward opposing side edges 244 of optical layer 242. Optionally, the light can be directed toward an edge of LCD panel 234. This embodiment comprises an edge lighting panel display system where the one or more LED chips direct light towards edges, rather than directly behind, the panels of panel display system 230. LED chips 236 can be arranged in any suitable manner, such as in an array, and can be in any suitable LED package or outside of a package. LED chips 236 can be connected to a structure that can be positioned directly against and in contact with side edges 244 or can be spaced apart from side edges 244. As shown in FIG. 21B, LED chips 236 are shown spaced apart for illustration purposes only.

FIG. 22 illustrates one embodiment of an illumination panel used in a LED backlighting system according to the subject matter herein. As previously noted. LED chips attached within LED packages described herein can comprise a robust metal-to-metal die attach such as, but not limited to, flux eutectic, non-eutectic, and thermal compression die attach. FIG. 22 illustrates one or more LED packages 260 attached over illumination panel 232. LED package 260 can comprise any of the improved resin filling and high adhesion LED packages described herein. For example, LED package 260 can be similar in form and function to LED packages 40, 110, 120, and 160 previously described. Illumination panel 232 can comprise a fully integrated, solid electrically and thermally conductive panel, or in the alternative it can comprise one or more layers. In one aspect, illumination panel 232 can comprise a MCPCB having an electrically conductive layer 262 to which LED packages 260 can mount. One or more electrically insulating but thermally conductive layers 264 can be disposed adjacent and under electrically conductive layer 262. In one aspect, thermally conductive layer 264 comprises a dielectric layer. A core layer 266 can be disposed adjacent and under thermally conductive layer 264. In one aspect, core layer 266 can comprise a metal core substantially formed wholly of aluminum or copper.

As FIG. 22 illustrates one or more LED chips can be arranged in LED packages 260 over illumination panel 232. At least one LED can be arranged within the package, however, more than one LED can also be mounted therein. In one aspect, emitter packages 260 can comprise a body structure formed using improved plastic materials previously described. In other aspects, LED packages 260 can comprise a body formed using any suitable plastic, non-plastic, silicone, or ceramic material. Packages can comprise a reflector cavity having encapsulant E disposed therein, and the encapsulant can be filled to any suitable level within package 260. LED chips can be attached within packages 260 using assisted eutectic, non-eutectic, or thermal compression die attach. Encapsulant E can be dispensed or otherwise placed in a package 260 to an amount even with the body structure, or to an amount such that a concave or convex surface forms. Encapsulant E can comprise one or more phosphors for emitting light of a desired wavelength. LED packages used in backlighting can comprise electrical elements where at least a portion of the electrical element is displaced a distance from a point P and/or the cavity floor. In one aspect, a portion of the electrical elements can be removed, etched, and/or bent such that they are positioned below or inboard point P. In one aspect, a portion of electrical elements disposed within an LED package can non-planar, such that a first portion is disposed on a first plane and a second portion is disposed on a different second plane as illustrated in FIGS. 4 to 5B. As illustrated, a portion of electrical element of package 260 can be removed such that it is displaced a distance of a gap G formed between the body and electrical element. Gap G can form, in part, by electrical lead 130 which can comprise one or more openings 138 for body material to mold into. At least a portion of the body which molds into openings 138 can form a portion of the cavity floor inboard of point P.

LED packages and methods such as those described herein can be used in association with any suitable general lighting environments or applications, and are not limited for use with panel systems. LED chips for use in backlighting or other panel display systems can comprise an arrangement or planar arrays of red, green, and blue LED emitters configured to emit light that appears as a pixel of white light in operation. Sizes of red, green, and blue LED chips can be selected to meet a desired brightness and/or intensity balancing level. Any configuration of the red, green, and blue LED chips can be used. LED packages and/or LED chips utilizing metal-to-metal die attach methods as described herein can be used in backlighting systems and any suitable display panel system 230. For example and without limitation. LED packages and/or LED chips used in backlighting and display panel systems can offer light output of up to 122 lumens at 300 mA in cool white (CW), and up to 100 lumens at 300 mA in warm white (WW) color points. For example, LED packages and/or LED chips disclosed herein can be used in lighting fixtures comprising fixtures used in display panel systems offering a minimum CRI for CW color points of 65. LED packages and/or LED chips disclosed herein can be used in lighting fixtures comprising fixtures used in display panel systems offering a minimum CRI for CW color points of 75 which corresponds to a CCT range of 5,000 K to 8,300 K. LED packages and/or LED chips disclosed herein for use in display panel systems can also offer, for example, a minimum CRI for WW color points of 80 which corresponds to a CCT range of 2,600 K to 3,700 K. Such LED packages and/or LED chips can be used for both standard and high voltage configurations.

Embodiments of the present disclosure shown in the drawings and described above are exemplary of numerous embodiments that can be made within the scope of the appended claims. It is contemplated that the configurations of thinner LED packages, systems, and methods with improved resin filling and improved adhesion can comprise numerous configurations other than those specifically disclosed herein.

What is claimed is:

1. A high brightness package for housing light emitters, the package comprising:
   a body;
   a cavity disposed in the body, the cavity comprising a cavity floor and at least one cavity wall, wherein the cavity wall intersects the cavity floor at an intersection area of the body; and
   at least one electrical element disposed in a portion of the body, wherein the at least one electrical element comprises a conductive surface, at least two external portions, and one or more transitional zones disposed between the conductive surface and the at least two external portions;
   wherein the conductive surface forms a portion of the cavity floor for electrically connecting with one or more light emitters; and
   wherein the at least two external portions of the electrical element extend about an aperture, wherein the one or more transitional zones are disposed at at least one edge defining the aperture and are recessed into the body below the cavity floor such that a gap forms between the one or more transitional zones and the intersection area, wherein the gap is filled by the body, and wherein a portion of the aperture is filled by the body.

2. The package of claim 1, further comprising one or more light emitting diode (LED) chips attached to the electrical element.

3. The package of claim 1, wherein the body comprises a plastic body.

4. The package of claim 1, further comprising at least one thermal element, wherein one or more LED chips at least partially mounted over the thermal element.

5. The package of claim 4, wherein the thermal element is electrically isolated from the at least one electrical element.

6. The package of claim 4, wherein the body comprises plastic, and wherein the body at least partially encases the at least one electrical and thermal element.

7. The package of claim 1, wherein the one or more transitional zones are disposed on a different plane than the conductive surface.

8. The package of claim 1, wherein the one or more transitional zones comprise a recess.

9. The package of claim 1, wherein the one or more transitional zones comprise a linear sloping profile.

10. The package of claim 1, wherein the one or more transitional zones comprise a curved profile.

11. The package of claim 1, wherein the conductive surface of the electrical element is at least partially covered with an encapsulant.

12. The package of claim 1, wherein the one or more transitional zones are stamped, etched, or bent away from the cavity floor.

13. The package of claim 1, further comprising a thermal element that has at least one or more surfaces that extend away from the cavity floor.

14. The package of claim 1, wherein the body comprises a cavity angle of at least approximately 135° or more.

15. The package of claim 1, wherein the body comprises a cavity angle of at least approximately 139° or more.

16. The package of claim 1, wherein the body comprises a thickness of approximately 0.9 millimeters (mm) or less.

17. A high brightness package for housing light emitters, the package comprising:
a body;
a cavity disposed in the body, the cavity comprising a cavity floor and at least one cavity wall, wherein the cavity wall intersects the cavity floor at an intersection area of the body; and
a leadframe disposed within a portion of the body, the leadframe comprising at least one electrical element;
wherein the electrical element comprises one or more openings disposed therethrough, wherein each of the one or more openings are positioned below a portion of the intersection area, wherein at least one edge defining a respective one of the one or more openings in the at least one electrical element is disposed inboard of the intersection area such that a gap is disposed between the edge of the at least one electrical element and the intersection area such that an area disposed below the portion of the intersection area where the cavity wall intersects the cavity floor is devoid of the electrical element, and wherein the body at least partially fills the gap between the edge of the electrical element and the intersection area.

18. The package of claim 17, further comprising one or more light emitting diode (LED) chips.

19. The package of claim 17, wherein the body comprises a plastic body.

20. The package of claim 19, wherein the leadframe comprises a thermal element, the one or more LED chips at least partially mounted over the thermal element.

21. The package of claim 20, wherein the thermal element is electrically isolated from the at least one electrical element.

22. The package of claim 21, wherein the plastic body at least partially encases the at least one electrical and thermal elements.

23. The package of claim 17, wherein the gap is formed by stamping, punching, drilling, or etching the at least one electrical element or any combination thereof.

24. The package of claim 17, wherein the at least one electrical element is at least partially covered with an encapsulant.

25. The package of claim 17, wherein the body comprises a cavity angle of at least approximately 135° or more.

26. The package of claim 17, wherein the body comprises a cavity angle of at least approximately 139° or more.

27. The package of claim 17, wherein the body comprises a thickness of approximately 0.9 millimeters (mm) or less.

28. A display panel system comprising:
a panel;
at least one light emitting diode (LED) package for providing light to the panel,
the at least one LED package comprising:
a body;
a cavity disposed in the body, the cavity comprising a cavity floor and at least one cavity wall, wherein the cavity wall intersects the cavity floor at an intersection area of the body; and
at least one electrical element disposed in a portion of the body, the at least one electrical element comprising a conductive surface, at least two external portions, and one or more transitional zones disposed between the conductive surface and the at least two external portions;
wherein the conductive surface forms a portion of the cavity floor for electrically connecting with a light emitter; and
wherein the at least two external portions of the electrical element extend about an aperture, wherein the one or more transitional zones are disposed at at least one edge defining the aperture and are recessed into the body below the cavity floor such that a gap forms between the one or more transitional zones and the intersection area, wherein the gap is filled by the body, and wherein a portion of the aperture is filled by the body.

29. The display panel system of claim 28, wherein the body comprises a plastic body.

30. The display panel system of claim 29, wherein the plastic body at least partially encases the at least one electrical element and a thermal element.

31. The display system of claim 28, wherein the LED package directly backlights the panel.

32. The display panel system of claim 28, wherein the LED package is configured to illuminate the side edge of the panel.

33. The display panel system of claim 28, wherein the LED package comprises a thickness of approximately 0.9 millimeters (mm) or less.

34. The display panel system of claim 28, wherein the one or more transitional zones are formed by stamping, etching, or bending the electrical element.

35. The display panel system of claim 28, wherein the body comprises a cavity having a cavity angle of at least approximately 135° or more.

36. The display panel system of claim 28, wherein the body comprises a cavity having a cavity angle of at least approximately 139° or more.

* * * * *